(12) United States Patent
Frankel et al.

(10) Patent No.: US 10,239,749 B2
(45) Date of Patent: Mar. 26, 2019

(54) SYSTEMS AND METHODS FOR MEMS-BASED CROSS-POINT ELECTRICAL SWITCHING

(71) Applicant: Ciena Corporation, Hanover, MD (US)

(72) Inventors: Michael Y. Frankel, Baltimore, MD (US); John P. Mateosky, West River, MD (US)

(73) Assignee: Ciena Corporation, Hanover, MD (US)

( * ) Notice: Subject to any disclaimer, the term of this patent is extended or adjusted under 35 U.S.C. 154(b) by 1 day.

(21) Appl. No.: 15/834,185

(22) Filed: Dec. 7, 2017

(65) Prior Publication Data

US 2018/0111825 A1    Apr. 26, 2018

Related U.S. Application Data

(63) Continuation of application No. 14/027,818, filed on Sep. 16, 2013, now Pat. No. 9,868,631.

(51) Int. Cl.
   *B81B 7/00* (2006.01)
   *B81B 7/04* (2006.01)
   (Continued)

(52) U.S. Cl.
   CPC ............. *B81B 7/008* (2013.01); *B81B 7/04* (2013.01); *H04Q 11/00* (2013.01); *H04Q 11/0005* (2013.01); *B81B 2201/012* (2013.01); *H01H 59/0009* (2013.01); *H04Q 2011/0039* (2013.01); *H04Q 2213/1302* (2013.01); *H04Q 2213/1304* (2013.01); *Y10T 307/747* (2015.04)

(58) Field of Classification Search
   USPC ........................................................ 307/113
   See application file for complete search history.

(56) References Cited

U.S. PATENT DOCUMENTS

| 4,849,751 A | 7/1989 | Barber et al. |
|---|---|---|
| 6,366,716 B1 * | 4/2002 | Graves ............... H04Q 11/0005 359/341.1 |
| 6,658,177 B1 | 12/2003 | Chertow |
| 6,665,495 B1 | 12/2003 | Miles et al. |

(Continued)

OTHER PUBLICATIONS

Arun Vishwanath et al., "Estimating the Energy Consumption for Packet Processing, Storage and Switching in Optical-IP Routers," OFC 2013, OMA3A.6.

(Continued)

*Primary Examiner* — Rexford N Barnie
*Assistant Examiner* — Xuan Ly
(74) *Attorney, Agent, or Firm* — Clements Bernard Walker PLLC; Christopher L. Bernard; Lawrence A. Baratta, Jr.

(57) ABSTRACT

An electrical cross-point switch N inputs, each at least 10 Gbps, connected to input transmission lines; M outputs, each at least 10 Gbps, connected to output transmission lines; at least two Radio Frequency (RF) Microelectromechanical systems (MEMS) switches selectively interconnecting each input transmission line and each output transmission line; and control and addressing circuitry configured to selectively control interconnection of each input transmission line and each output transmission line via the at least two RF MEMS switches. The at least two RF MEMS switches can be embedded in each input transmission line and each output transmission line. The input transmission lines and the output transmission lines can each be partially shielded microwave transmission lines.

18 Claims, 17 Drawing Sheets

(51) Int. Cl.
*H04Q 11/00* (2006.01)
*H01H 59/00* (2006.01)

(56) References Cited

U.S. PATENT DOCUMENTS

| | | | |
|---|---|---|---|
| 6,704,307 B1 | 3/2004 | Graves et al. | |
| 6,888,420 B2 | 5/2005 | Schaffner et al. | |
| 8,003,906 B2 | 8/2011 | Ebeling et al. | |
| 8,704,408 B2 | 4/2014 | Becker et al. | |
| 9,157,952 B2* | 10/2015 | Becker | G01R 31/2844 |
| 2002/0159677 A1 | 10/2002 | Hsu et al. | |
| 2007/0235299 A1* | 10/2007 | Daneshmand | H01H 59/0009 200/18 |
| 2008/0019693 A1* | 1/2008 | Sorin | H04Q 11/0067 398/71 |
| 2012/0020663 A1 | 1/2012 | Mclaren et al. | |
| 2015/0179378 A1* | 6/2015 | Bannon | H01H 59/0009 307/115 |

OTHER PUBLICATIONS

Jun-De Jin et al., "Low-Loss Single and Differential Semi-Coaxial Interconnects in Standard CMOS Process," Microwave Symposium Digest, 2006. IEEE MTT-S International.

Jin-Woo Kim, "SiGe High Speed Crossbar Switch for Digital Signal Router and Phased Array Antenna Systems" Rensselaer Polytechnic Institute, Troy, New York, Jul. 2009.

Cardoso, "Design of High-Isolation and Wideband RF Switches in SiGe BiCMOS Technology for Radar Applications", PhD Thesis, Georgia Institute of Technology, May 2012.

Braun et al., "Single-chip MEMS 5×5 and 20×20 double-pole single-throw switch arrays for automating telecommuncation networks," J. Micromechanics and Microengineering, vol. 18, No. 1.

Jan. 7, 2015 International Search Report issued in International Patent Application No. PCT/US2014/055358.

* cited by examiner

SYSTEMS AND METHODS FOR MEMS-BASED CROSS-POINT ELECTRICAL SWITCHING

The present patent/application is a continuation of U.S. patent application Ser. No. 14/027,818, filed Sep. 16, 2013, and entitled "SYSTEMS AND METHODS FOR MEMS-BASED CROSS-POINT ELECTRICAL SWITCHING," the contents of which are incorporated by reference herein.

FIELD OF THE DISCLOSURE

Field of the Disclosure

The present disclosure relates generally to switching systems and methods. More particularly, the present disclosure relates to systems and methods for Microelectromechanical systems (MEMS)-based cross-point electrical switching.

BACKGROUND OF THE DISCLOSURE

Communication networks are continuing to grow, with current and projected rates in excess of 30% annualized increase in bandwidth. Such growth rates imply network bandwidth is doubling approximately every two-and-a-half years. At the same time, network hardware cost, space, and power consumption allocations are staying roughly flat. Equipment manufacturers must, therefore, deliver substantial continuous reductions in per-bit metrics related to cost, space, and power. Conventional network architectures utilize various layers in construction with higher layers providing more functionality, but at the expense of increased cost, size, and power. For example, at Layer 3, Internet Protocol (IP) router power consumption is dominated by packet storage and packet processing as described by A. Vishwanath et al., "Estimating the energy consumption for packet processing, storage and switching in optical-IP routers," OFC 2013, OMA3A.6. Layer 1 Optical Transport Network (OTN)-type circuit switching eliminates packet storage and substantially simplifies processing. Therefore, the remaining switching energy becomes dominant in OTN and other time division multiplexing (TDM) techniques.

Layer 0 has been largely implemented in the optical domain, and with optical wavelength switching functions. This layer operates on signal "flows," which are defined by their large granularity and by the momentary data loss during reconfiguration operations. These wavelength flows are configured only on capacity turn-up, and remain generally static thereafter in current networks, due to complex, large and slow optical wavelength switching fabrics. The dynamic optical switching function is further complicated by the noisy and analog nature of optical signal propagation, and by large uncertainties in predicting optical signal propagation performance. However, optical switching does provide low power consumption as it operates on very large bandwidth flows (i.e., wavelengths).

Conventionally, flow-based switching at Layer 0, i.e., wavelength switching, has been performed in the optical domain via Reconfigurable Optical Add/Drop Multiplexer (ROADM) devices which can use various techniques such as Wavelength Selective Switches (WSS). Disadvantageously, optical domain processing does not have the cost-reduction benefits of electronic domain processing. However, conventional techniques for electronic domain flow-based switching are costly and consume high power. As networks continue to grow, there is a need for dramatic cost, size, and power reductions in flow-based switching at high bandwidth granularity. At the same time, switching should be performed in the electronic domain preserving all the attendant advantages of switching predictability, ease of viable path computation, switching speed, etc.

Referring to FIGS. 1-4, in various exemplary embodiments, conventional techniques for flow-based cross-point switches can be divided into several categories. FIG. 1 illustrates a bipolar transistor current mode logic (CML) 4:1 multiplexer 10 which is an active switch based on CML multiplexers. Input signals are first fanned-out to a set of multiplexers. The multiplexer connected to a particular output selects which input is connected to the corresponding output. Level 1 provides active data switching, and Level 2 and 3 provide input selection (i.e., addressing). This is described in J. W. Kim, "Ge High Speed Cross-point Switch for Digital Signal Router and Phased Array Antenna Systems," Ph.D. Thesis, Rensselaer Polytechnic Institute, Troy, N.Y., July 2009 (www.ecse.rpi.edu/frisc/theses/KimThesis/Kim_Thesis 2009.pdf). FIG. 2 illustrates a BiCMOS 4:1 multiplexer 20 which can lower power consumption relative to the bipolar CIVIL 4:1 multiplexer 10 by replacing the "address" Level 2 and 3 with field-effect transistor (FET) based devices since their switching speed can be substantially lower than the data rate. BiCMOS is an integration of bipolar junction transistors and Complementary metal-oxide-semiconductor (CMOS) transistors. However, both of the multiplexers 10, 20 draw substantial amounts of continuous current and are therefore quite high in power consumption. For example, a commercial version of such architecture in a 160×160 cross-point switch at 6.5 Gbps consumes approximately 23 W.

FIG. 3 is a CMOS 8:1 multiplexer 30 based on AND gates. This is described, for example, in U.S. Pat. No. 4,849,751 to Barber et al. entitled "CMOS Integrated circuit digital crossbar switching arrangement." The CMOS 8:1 multiplexer 30 requires significant input data parallelization to a wide bus as CMOS gates cannot run directly at high data rates such as 10 Gbps, 28 Gbps, etc. Also, deep submicron CMOS still consumes substantial power even in a standby state due to leakage currents, and total power consumption for the circuit can be quite significant.

FIG. 4 is a FET-based through switch 40 (M2 and M4) with shunts for isolation (M1 and M3). The FET transistors can be used as direct ON/OFF switches for controlling the connection path of analog Radio frequency (RF) signals. There are several issues with such an approach, which include fairly high insertion loss of ~2 dB for the configuration shown in FIG. 4, somewhat limited power handling capability, and generation of nonlinear harmonics within active devices which have signal corrupting potential.

RF MEMS switches have a potential for very low insertion losses, of the order of 0.5 dB and below, high RF isolation, pure linear operation, good power handling capability, etc. The complexity of such switch matrixes has so far been rather limited in size, mostly due to the limited needs of the application spaces for which they were designed: switched RF filters, spectral band switching in cell phones, and antenna switching. The largest cross-point array known to the inventors is a 20×20 one developed for automating main distribution frames in copper-wire telecom networks as described in Braun et al. "Single-chip MEMS 5×5 and 20×20 double-pole single-throw switch arrays for automating telecommunication networks," J. Micromechanics and Microengineering, vol. 18, no 1. The 20×20 array occupied an area of 14×10 mm$^2$ and exhibited ON-state series resistance in the range of 0.08 to 2.33 Ohm.

BRIEF SUMMARY OF THE DISCLOSURE

In an exemplary embodiment, an electrical cross-point switch includes N inputs, each at least 10 Gbps, connected to input transmission lines; M outputs, each at least 10 Gbps, connected to output transmission lines; at least two Radio Frequency (RF) Microelectromechanical systems (MEMS) switches selectively interconnecting each input transmission line and each output transmission line; and control and addressing circuitry configured to selectively control interconnection of each input transmission line and each output transmission line via the at least two RF MEMS switches. The at least two RF MEMS switches can be embedded in each input transmission line and each output transmission line. The input transmission lines and the output transmission lines can be each partially shielded microwave transmission lines. N and M are equal and greater than or equal to 32. The at least two RF MEMS switches can be each formed on a first die with the input transmission lines and the output transmission lines, and wherein the control and addressing circuitry can be formed on a second die interconnected to the first die through silicon vias, micro bumps, or metal pillars. The first die and the second die can be flip-chip attached. The at least two RF MEMS switches can be each formed on a first die with interconnections between one another through one of differential semi-coax style (D-SC) and single semi-coax (S-SC) structures.

The control and addressing circuitry can include digital control implemented on a separate substrate from each of the at least two RF MEMS switches, the input transmission lines, and the output transmission lines. The control and addressing circuitry can be implemented in CMOS. The at least two RF MEMS switches can include three RF MEMS with a first RF MEMS switch on the respective input transmission line, a second RF MEMS switch on the respective output transmission line, and a third RF MEMS switch interconnecting the respective input transmission line and the respective output transmission line. The at least two RF MEMS switches can utilize a row fan-out to column fan-out between the input transmission lines and the output transmission lines. The at least two RF MEMS switches can utilize a simple cantilever MEMS switch each with a cantilever beam, a pull-down electrode, and an RF transmission line electrode. The at least two RF MEMS switches can utilize a direct-contact cantilever MEMS switch each with a cantilever beam, a pull-down electrode, an RF transmission line electrode, and a dimple on the cantilever beam that makes contact with the RF transmission line electrode during an ON state.

In another exemplary embodiment, an electrical cross-point switch system includes a first die including N inputs, each at least 10 Gbps, connected to input transmission lines, M outputs, each at least 10 Gbps, connected to output transmission lines, and at least two Radio Frequency (RF) Microelectromechanical systems (MEMS) switches selectively interconnecting each input transmission line and each output transmission line; a second die including control and addressing circuitry configured to selectively control interconnection of each input transmission line and each output transmission line via the at least two RF MEMS switches; and interconnections between the one or more first die and the second die through silicon vias, micro bumps, or metal pillars.

In a further exemplary embodiment, a method includes receiving N inputs, each at least 10 Gbps, at input transmission lines; selectively interconnecting each input transmission line to a respective output transmission line via at least two Radio Frequency (RF) Microelectromechanical systems (MEMS) switches; and controlling the at least two RF MEMS switches to provide cross-point switching between the N inputs and M outputs.

In an exemplary embodiment, a Microelectromechanical systems (MEMS)-based N×M cross-point switch includes N inputs each at least 10 Gbps; M output each at least 10 Gbps; a plurality of Radio Frequency (RF) MEMS switches selectively interconnecting the N inputs to the M outputs; and control and addressing circuitry to selectively control the plurality of RF MEMS switches to switch each of the N inputs to a corresponding output of the M outputs. N and M can be at least 32. Optionally, the plurality of RF MEMS switches can be arranged in a multi-stage Clos architecture. Alternatively, the plurality of RF MEMS switches can be arranged in a torus architecture. Each of plurality of RF MEMS switches can include a cantilever beam-based MEMS switch. The plurality of RF MEMS switches can be applied to differential signaling. Each of the N inputs can correspond to a wavelength in an optical communication system, and wherein the plurality of RF MEMS switches provide flow-based switching in the optical communication system for a Reconfigurable Electrical Add/Drop Multiplexer.

The plurality of RF MEMS switches can be formed on a first die and the control and addressing circuitry can be formed in a second die interconnected to the first die through silicon vias, micro bumps, or metal pillars. Optionally, the first die and the second die are flip-chip attached. The plurality of RF MEMS switches can form a multi-stage switch with a plurality of stages, wherein a first set of the plurality of stages is formed on a first die and a second set of the plurality of stages is formed on a second die, and wherein the first set of the plurality of stages is interconnected with the second set of the plurality of stages through silicon vias, micro bumps, or metal pillars between the first die and the second die. The plurality of RF MEMS switches can be formed on a first die with interconnections between the plurality of RF MEMS switches through one of differential semi-coax style (D-SC) and single semi-coax (S-SC) structures.

The control and addressing circuitry can include digital control implemented on a separate substrate from the plurality of RF MEMS switches. The control and addressing circuitry can be implemented in CMOS. Optionally, a signal path from one of the N inputs to one of the M outputs can include three RF MEMS switches of the plurality of RF MEMS switches. Alternatively, a signal path from one of the N inputs to one of the M outputs can include two RF MEMS switches of the plurality of RF MEMS switches.

In another exemplary embodiment, a MEMS-based system includes one or more first die including a plurality of Radio Frequency (RF) MEMS switches selectively interconnecting N inputs to M outputs in a cross-point switch, wherein the N inputs and the M outputs are each at least 10 Gbps and N and M are at least 32; a second die including control and addressing circuitry to selectively control the plurality of RF MEMS switches to switch each of the N inputs to a corresponding output of the N outputs; and interconnections between the one or more first die and the second die through silicon vias, micro bumps, or metal pillars. Optionally, the one or more first die and the second die are flip-chip attached.

The MEMS-based system can further include a printed circuit board (PCB) to which the second die is disposed; controlled collapse chip connection (C4) balls connecting a passive interposer layer to the second die and the PCB; and micro-bump or copper pillar connections between the one or more first die and the passive interposer layer. The cross-point switch can include a plurality of stages, wherein a first set of the plurality of stages is formed on a first die of the one or more first die and a second set of the plurality of stages is formed on a second die the one or more first die, and wherein the first set of the plurality of stages is interconnected with the second set of the plurality of stages through silicon vias between the first die the one or more first die and the second die the one or more first die.

In yet another exemplary embodiment, a method includes providing one or more of N inputs each at least 10 Gbps to a Microelectromechanical systems (MEMS)-based N×M cross-point switch including a plurality of RF MEMS switches, where N and M are at least 32; configuring control and addressing circuitry located on a separate substrate from the plurality of RF MEMS switches; and selectively switching the one or more of N inputs to one or more of M outputs each at least 10 Gbps based on the configuration of the control and addressing circuitry.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

In various exemplary embodiments, systems and methods for MEMS-based cross-point electrical switching are described. The systems and methods provide an electrical switching fabric for flow-based switching corresponding to wavelengths that can be part of a Reconfigurable Electrical Add/Drop Multiplexer (READM) with similar functionality as a ROADM in the electronic domain. The systems and methods include an RF MEMS matrix for providing reconfigurable connectivity between input and output electrical ports. Layer 0 type flow-oriented switching requires infrequent reconfiguration, on the order of minutes to days, and associated power consumption is determined purely by the passive RF loss of the MEMS switches. Since the contemplated application is a Layer 0 flow-based switch, the inputs and the outputs will be at least 10 Gbps to switch wavelengths. The RF switches are embedded in on-chip transmission lines and may be fabricated on a variety of low-loss, low-cost substrates, including high resistivity Si, glass, etc. Typical transmission line and MEMS geometries are in the range of microns, and only coarse, inexpensive photolithography is required. In an exemplary embodiment, the electrical switching fabric can include an N×M cross-point switch with N and M greater than or equal to 32.

The systems and methods can be used in a large port count, all-electronic N×M switch with extremely low power consumption (relative to conventional electronic switches). Advantageously, an RF MEMS switch implementation has an extremely low power consumption in that the MEMS switches have relatively zero ON and OFF state power consumption. Further, the systems and methods have minimal timing/retiming requirements. The systems and methods can explicitly remove or minimize phase lock loop (PLL) and timing circuitry in the N×M switch because a crossbar switch is agnostic from a timing point-of-view.

The RF MEMS switches can be a low-cost large geometry photolithography on a low-cost, high resistivity substrate. In a READM, the systems and methods include a fully non-blocking, reconfigurable signal flow switch configuration. In an exemplary embodiment, the switches can support high data rates of 28 Gbps and above, required for future signal bandwidths, including support for differential signaling for good signal integrity. The RF MEMS switches can be tightly coupled with conventional Complementary metal-oxide-semiconductor (CMOS) circuits for signal conditioning and output line driver implementation. The systems and methods can include MEMS-based digital control electronics with negligible standby power consumption and ability to drive RF MEMS control lines which is perfect for infrequent reconfiguration. Advantageously, the systems and methods have very high RF performance compared to semiconductor circuit implementations, i.e., Higher RF Isolation, Higher Cutoff Frequency, Lower Loss, Lower Power Consumption, etc.

Figure 1:
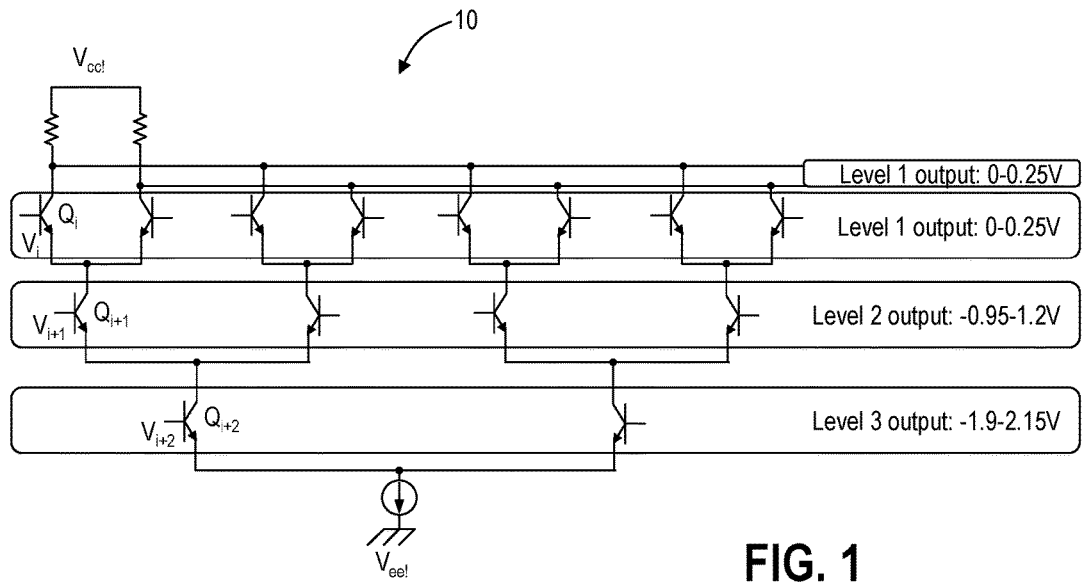
FIG. 1 is circuit diagram of a bipolar transistor-based current mode logic (CIVIL) 4:1 multiplexer.
Figure 2:
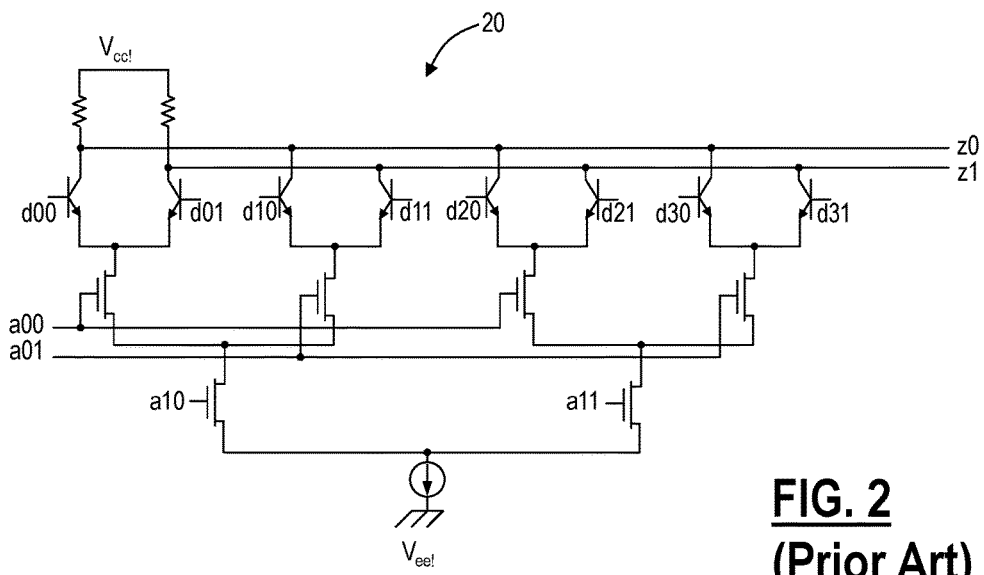
FIG. 2 is circuit diagram of a BiCMOS 4:1 multiplexer which can lower power consumption relative to the bipolar CML 4:1 multiplexer of FIG. 1.
Figure 3:
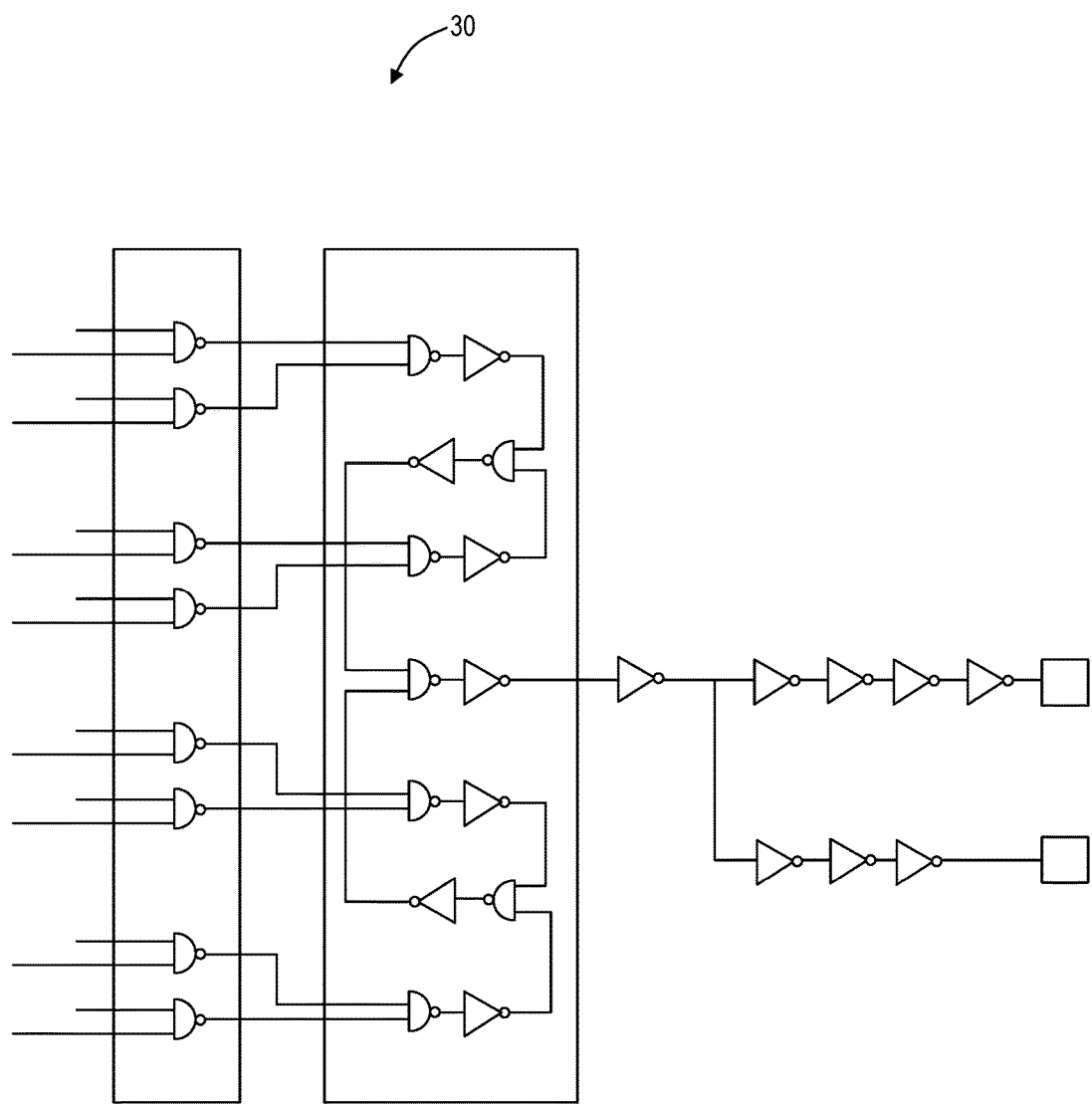
FIG. 3 is circuit diagram of a CMOS 8:1 multiplexer based on AND gates.
Figure 4:
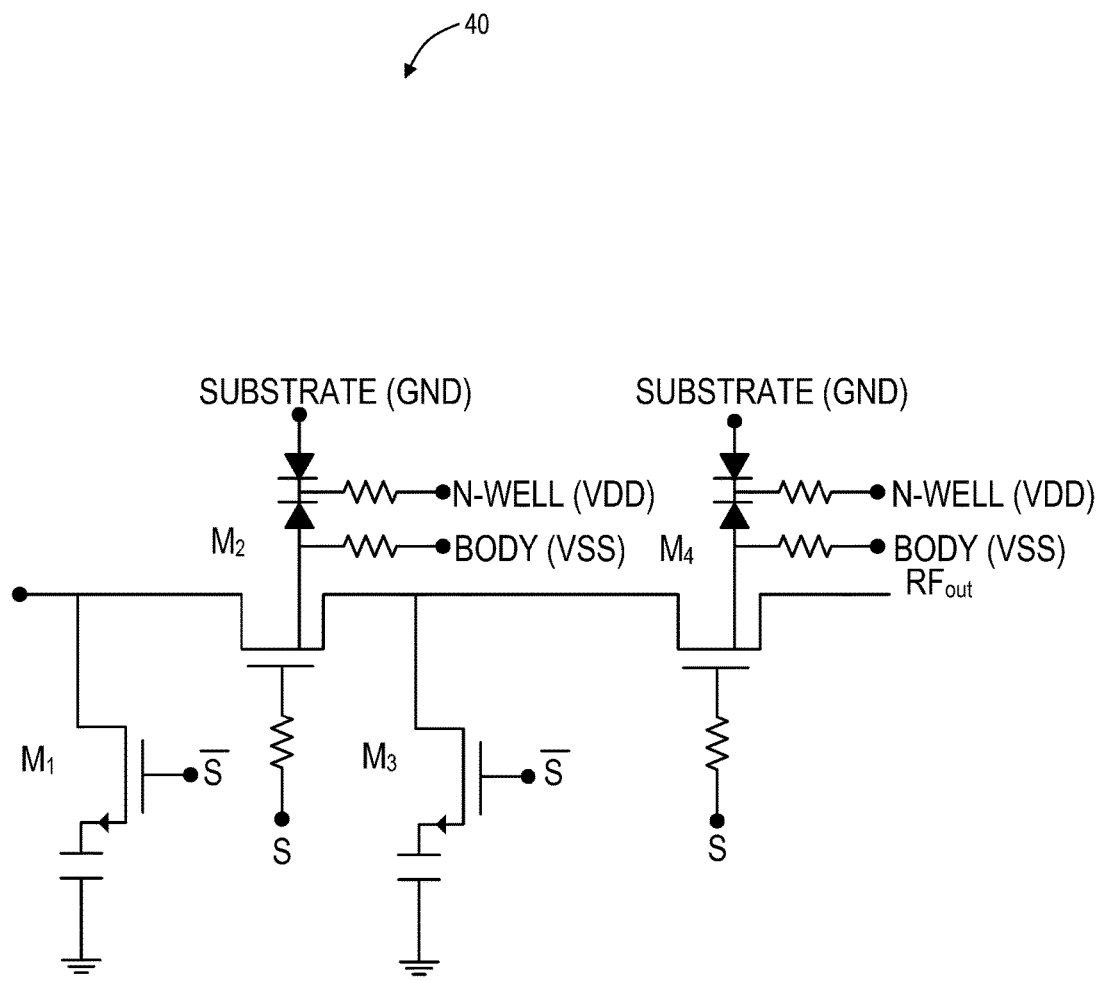
FIG. 4 is circuit diagram of a FET-based through switch with shunts for isolation.
Figure 5:
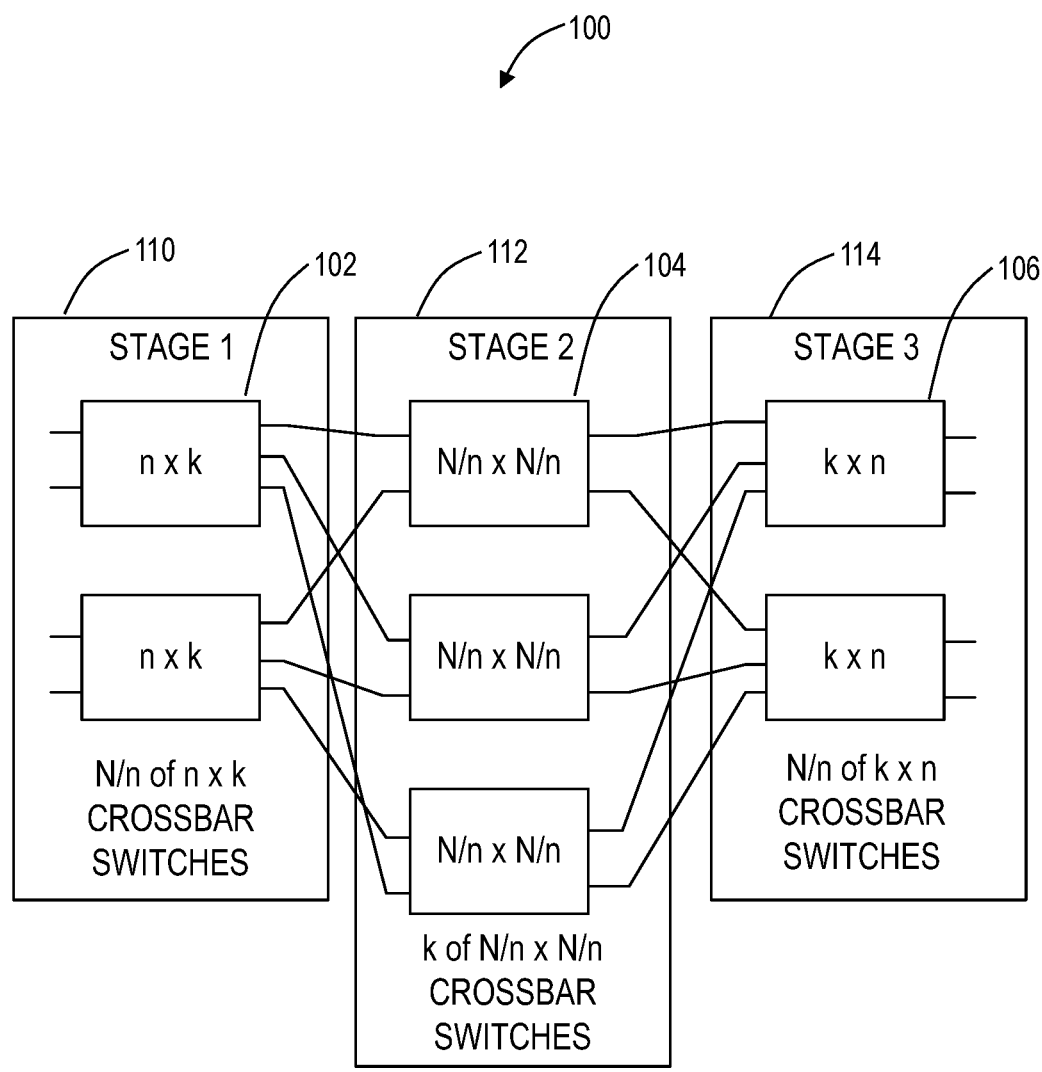
FIG. 5 is a schematic diagram of an N×N Clos switch utilizing RF MEMS-based crossbar switches.

Referring to FIG. 5, in an exemplary embodiment, a schematic diagram illustrates an N×N Clos switch 100 utilizing RF MEMs-based crossbar switches 102, 104, 106. In this exemplary embodiment, the N×N Clos switch 100 is a three-stage Clos architecture with a first stage 110 as an ingress stage, a second stage 112 as a center stage, and a third stage 114 as an egress stage. The first stage 110 includes N/n of n×k crossbar switches 102, the second stage 112 includes k of N/n×N/n crossbar switches 104, and the third stage 114 includes N/n of k×n crossbar switches 106. Each of the crossbar switches 102, 104, 106 is an RF MEMS-based switching circuit as is described herein. The variables N, n, and k are all integers, and the N×N Clos switch 100 includes strictly non-blocking connectivity when k is greater than or equal to 2n−1. In the Clos architecture, each of the crossbar switches 102, 104, 106 is a smaller sized switch that is interconnected together to form the larger N×N Clos switch 100. For example, the crossbar switches 102 are n×k MEMS-based switches, the crossbar switches 104 are N/n×N/n MEMS-based switches, and the crossbar switches 106 are k×n MEMS-based switches. Further, in this exemplary embodiment, the Clos switch 100 is illustrated as N×N, but those of ordinary skill in the art will recognize that the present disclosure contemplates an N×M switch with N inputs, M outputs, and with N possibly, but not necessarily equal to M.

In an exemplary embodiment, the N×N Clos switch 100 is a 128×128 cross-point switch, i.e., N=128, and the individual inputs/outputs support bandwidth rates of 25-28 Gbps providing a total bandwidth of 3.2 Tbps. In an exemplary embodiment, N=128, n=8, and k=9, the first stage 110 would include 128/8 or 16 8×9 crossbar switches 102, the second stage 112 would include 9 16×16 crossbar switches 104, and the third stage 114 would include 16 9×8 crossbar switches 106. Again, this exemplary embodiment, for the 128×128 switch 100 includes a total of 4608 MEMS switches. The systems and methods contemplate any values of N, n, and k, and preferably, N is greater than or equal to 32 to provide enough capacity for Layer 0 flow-based switching of wavelengths in an optical network.

Figure 6:
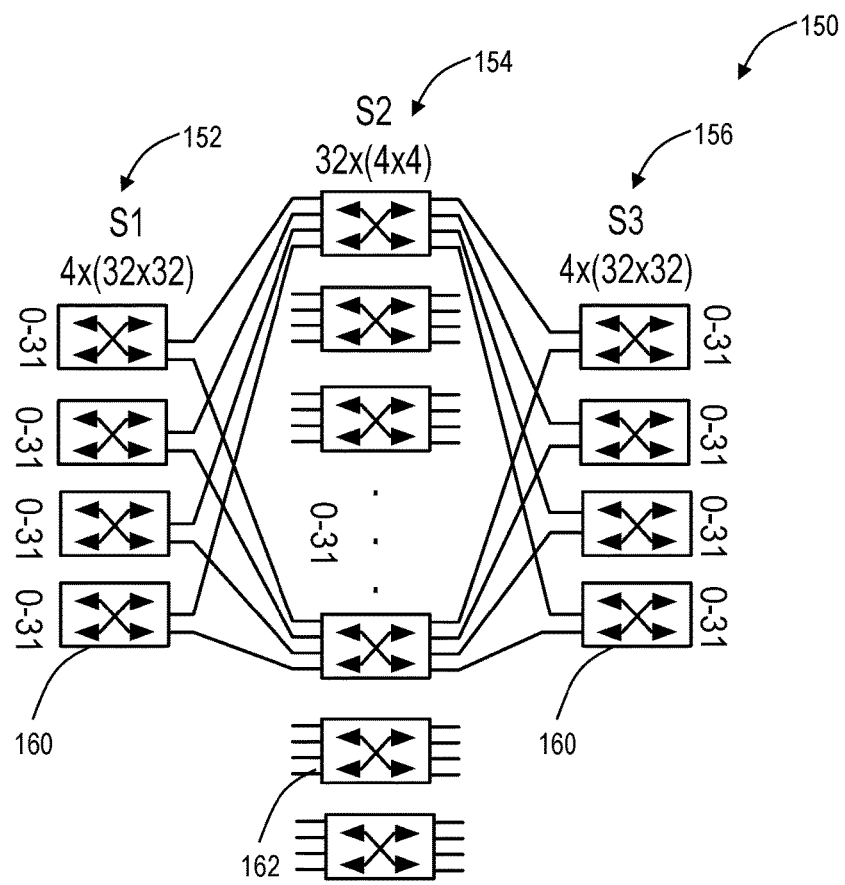
FIG. 6 is a schematic diagram of a 128×128 three-stage Clos switch.

Referring to FIG. 6, in an exemplary embodiment, a schematic diagram illustrates another 128×128 Clos switch 150 which is a three-stage Clos switch showing additional detail from FIG. 5. Again the 128×128 Clos switch 150 includes three stages 152, 154, 156. In this exemplary embodiment, N=128, n=k=32, so the first stage 152 includes 4 32×32 crossbar switches 160, the second stage 154 includes 32 4×4 crossbar switches 162, and the third stage includes 4 32×32 crossbar switches 160. By selecting n=k, the stages 152, 156 can utilize the same switches 160. The advantage of the Clos architecture is a reduction in a number of switches as pure cross-point type architecture for a 128×128 grid would require 16384 MEMS switches. For example, the Clos switch 100 includes a total of 4608 MEMS switches and the Clos switch 150 includes 8704 MEMS switches.

Figure 7A:
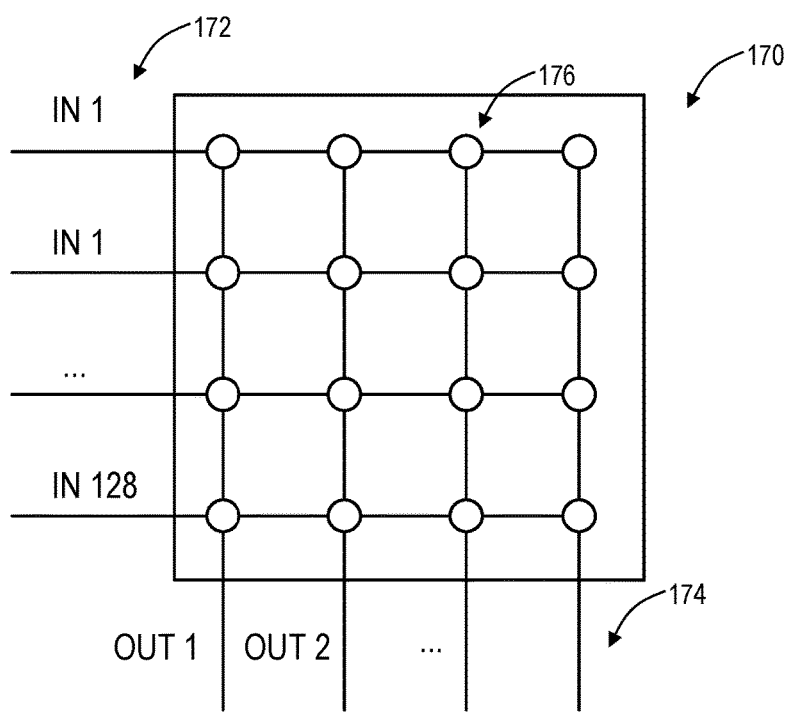
FIG. 7A is a schematic diagram of a single stage cross-point switch.

Referring to FIG. 7A, in an exemplary embodiment, a schematic diagram illustrates an N×N cross-point switch 170. For illustration purposes in FIG. 7A, N is illustrated as 128, but those of ordinary skill in the art will recognize any value is contemplated for N, again preferably N is greater than or equal to 32. Further, the cross-point switch 170 can also be N×M where N may or may not equal M, and N and M are preferably greater than or equal to 32. For illustration, purposes, the cross-point switch 170 includes 128 inputs 172 and 128 outputs 174. The inputs 172 are switched to the outputs 174 based on N×N total MEMS cross-points 176. That is, the cross-points 176 are either open or closed to selectively switch each input 172 to a corresponding output 174.

The cross-point switch 170 can be referred to as a sub-switch that is used to construct the Clos configurations of the Clos switch 100, 150. Specifically, in FIG. 5, the Clos switch 100 can be implemented with each of the switches 102, 104, 106 being the cross-point switch 170, i.e., the switch 102 is an n×k cross-point switch 170, the switch 104 is an N/n×N/n cross-point switch 170, and the switch 106 is a k×n cross-point switch 170. In FIG. 6, the Clos switch 150 can be implemented with each of the switches 160, 162 being the cross-point switch 170, i.e., the switch 160 is a 32×32 cross-point switch 170, and the switch 162 is a 4×4 cross-point switch 170. Additionally, the cross-point switch 170 can simply be a single stage switch.

Figure 7B:
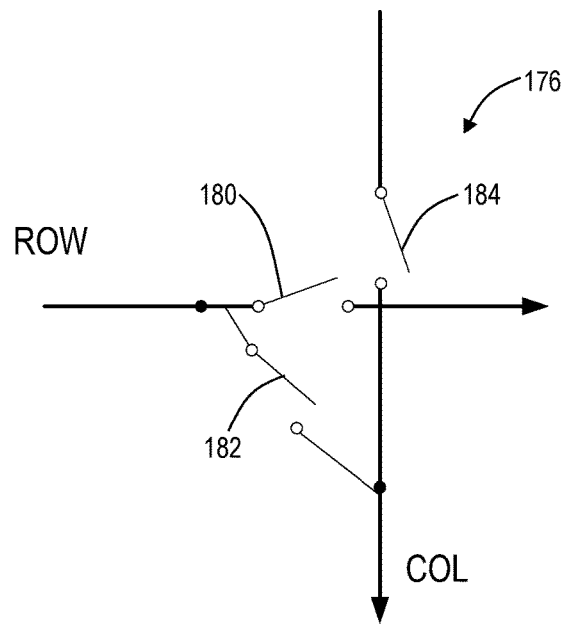
FIGS. 7B-7C are schematic diagrams of the exemplary functionality of the cross-point switch in FIG. 7A with RF MEMS-based switches.
Figure 7C:
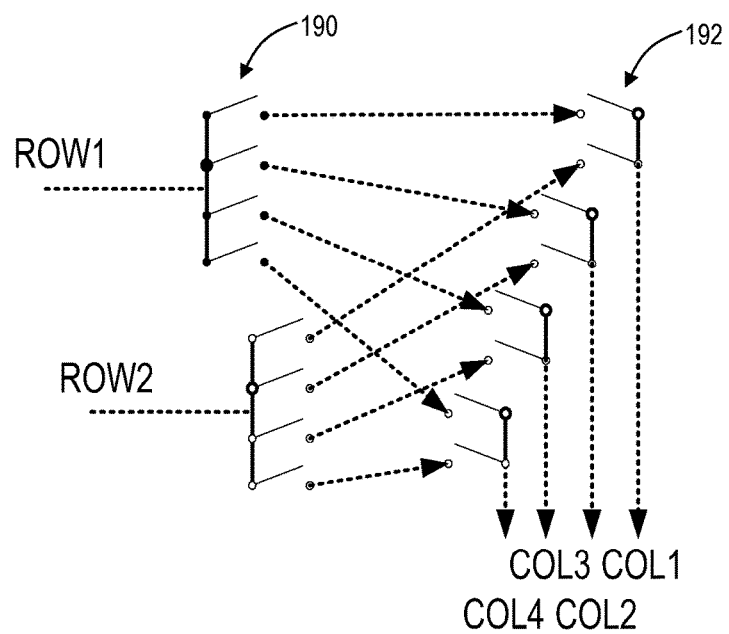

Referring to FIGS. 7B-7C, in an exemplary embodiment, a schematic diagram illustrates the exemplary functionality of the cross-point switch 170 with RF MEMS-based switches. FIG. 7B is a schematic diagram of an exemplary cross-point 176 in the cross-point switch 170 for one exemplary implementation. Here, the cross-point 176 includes three RF MEMS-based switches 180, 182, 184 including two RF MEMS-based switches 180, 182 forming a row and the RF MEMS-based switch 184 forming the column. The RF MEMS-based switches 180, 182 determine if the RF signal path terminates at a column (by closing the switch 182) or continues on the row (by closing the switch 180). The RF MEMS-based switch 184 determines if the column is open or closed. The implementation of FIG. 7B requires three RF MEMS-based switches 180, 182, 184 per cross-point 176.

FIG. 7C is a schematic diagram of various exemplary cross-points 176 in the cross-point switch 170 for another exemplary implementation. Here, two rows are shown with row RF MEMS-based switches 190 and four columns are shown with column RF MEMS-based switches 192. In this exemplary implementation, RF signals go through only two RF MEMS-based switches 190, 192. The dashed lines are the RF signal paths. The RF MEMS-based switches 190, 192 come in pairs as indicated by arrows. So, when a "Row" switch 190 is closed, a corresponding "Col" switch 192 is closed. This implementation provides a Row Fan-out-→switch→transmission line→switch→Column Fan-In configuration.

Each of the connections in the switches 102, 104, 106, 150, 160, 162 can be an RF MEMS-based switch as illustrated in FIGS. 7B-7C. In operation, the MEMS-based switch is either open for OFF or closed for ON to make a connection providing reconfigurable connectivity between input and output electrical ports. Again, Layer 0 (wavelength) type flow-oriented switching requires infrequent reconfiguration, on the order of minutes to days, and associated power consumption of the switches 102, 104, 106, 150, 160, 162 is determined purely by the RF loss of the MEMS-based switches. The MEMS-based switches are embedded in on-chip transmission lines and may be fabricated on a variety of low-loss, low-cost substrates, including high resistivity Si, glass, etc. Typical transmission line and MEMS geometries are in the range of microns, and only coarse, inexpensive photolithography is required for the MEMS-based switches. The following table compares FET, PIN Diode, and RF MEMs Switching Technologies.

| Parameter | RF MEMS | PIN | FET |
| --- | --- | --- | --- |
| Voltage (V) | 20-80 | +/−3-5 | 3-5 |
| Current (mA) | 0 | 3-20 | 0 |
| Power Consumption (mW) | 0.05-0.1 | 5-100 | 0.05-0.1 |

-continued

| Parameter | RF MEMS | PIN | FET |
|---|---|---|---|
| Switching time | 1-300 μs | 1-100 ns | 1-100 ns |
| $C_{up}$ (series) (fF) | 1-6 | 40-80 | 70-140 |
| R (series) (Ohms) | 0.5-2 | 2-4 | 4-6 |
| Capacitance ratio | 40-500 | 10 | n/a |
| Cutoff frequency (THz) | 20-80 | 1-4 | 0.5-2 |
| Isolation (1-10 GHz) | Very High | High | Medium |
| Isolation (10-40 GHz) | Very High | Medium | Low |
| Isolation (60-100 GHz) | High | Medium | None |
| Loss (1-100 GHz) (dB) | 0.05-0.2 | 0.3-1.2 | 0.4-2.5 |
| Power Handling (W) | <1 | <10 | <10 |
| Third-order intercept point (dBm) | +66-80 | +27-45 | +27-45 |

Figure 8:
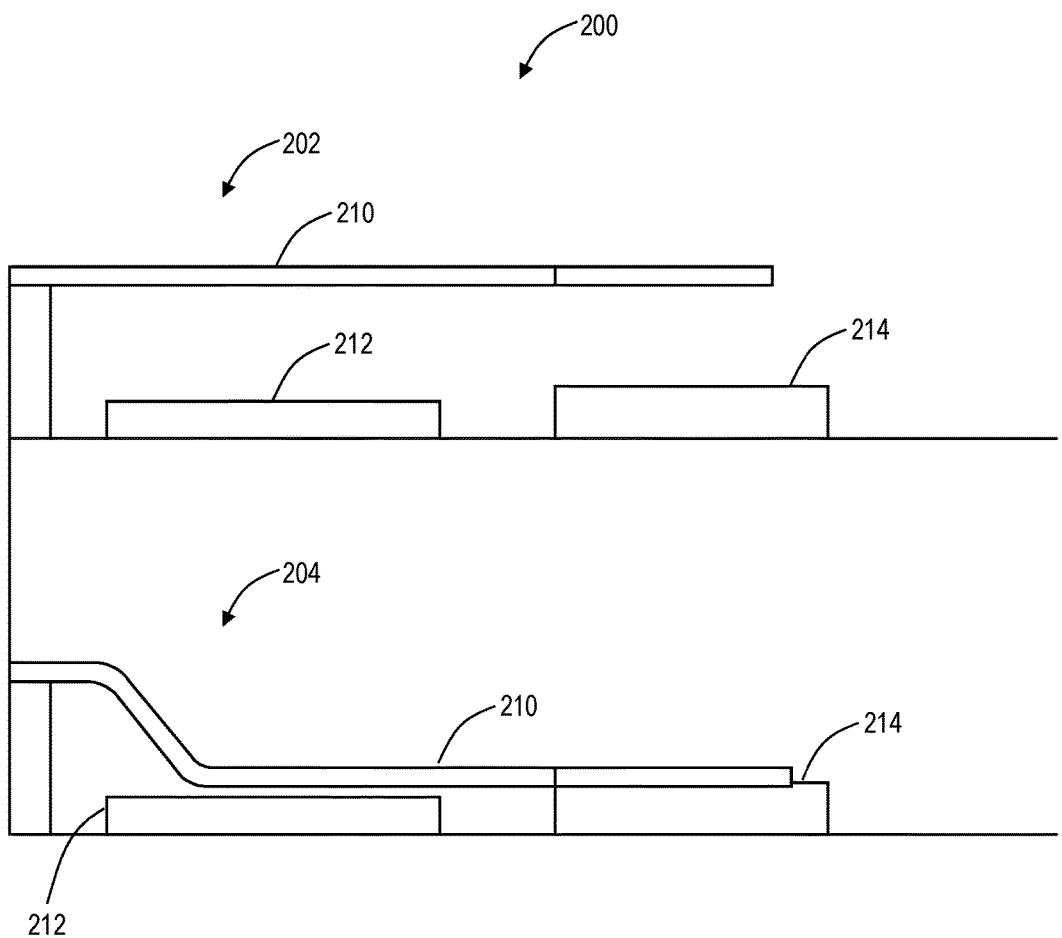
FIG. 8 is a schematic diagram of a simple cantilever MEMs switch for the RF MEMS-based switches in the switches of FIG. 5-7.

Referring to FIG. 8, in an exemplary embodiment, a schematic diagram illustrates a simple cantilever MEMs switch 200 for the RF MEMS-based switches in the switches 102, 104, 106, 150, 160, 162, 180, 182, 184, 190, 192. FIG. 8 illustrates the cantilever MEMS switch 200 in an OFF state 202 and an ON state 204. The cantilever MEMS switch 200 includes a cantilever beam 210, a pull-down electrode 212, and an RF transmission line electrode 214. The cantilever beam 210 is selectively moveable based on the pull-down electrode 212. In the OFF state 202, the pull-down electrode 212 is OFF, and the cantilever beam 210 is not in contact with the RF transmission line electrode 214. In the ON state 204, the pull-down electrode 212 is ON bringing the cantilever beam 210 in contact with the RF transmission line electrode 214. From a signal flow perspective, input signals flow through the cantilever beam 210 to the RF transmission line electrode 214.

Figure 9:
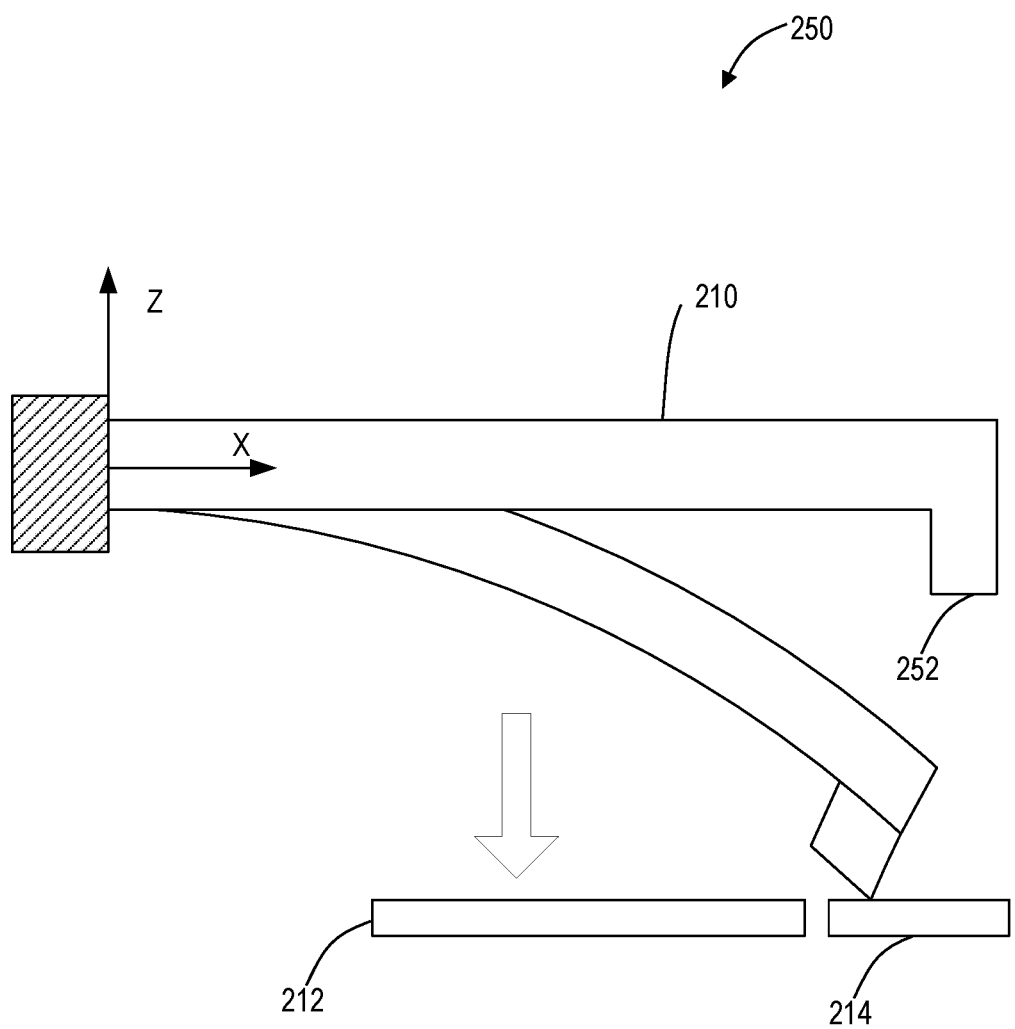
FIG. 9 is a schematic diagram of a direct-contact cantilever beam MEMS switch for the RF MEMS-based switches in the switches of FIG. 5-7.

Referring to FIG. 9, in an exemplary embodiment, a schematic diagram illustrates a direct-contact cantilever beam MEMS switch 250 for the RF MEMS-based switches in the switches 102, 104, 106, 150, 160, 162, 180, 182, 184, 190, 192. Similar to the cantilever MEMs switch 200, the direct-contact cantilever beam MEMS switch 250 includes a cantilever beam 210, a pull-down electrode 212, and an RF transmission line electrode 214. The direct-contact cantilever beam MEMS switch 250 includes a dimple 252 at the end of the cantilever beam 210 that makes contact with the RF transmission line electrode 214 during the ON state. For example, cantilever beam MEMS switches are described in Shalaby et al., "Robust Design of RF-MEMS Cantilever Switches Using Contact Physics Modeling," IEEE Transactions on Industrial Electronics, Volume 56, No. 4, April 2009, the contents of which are incorporated by reference herein.

The direct-contact cantilever beam MEMS switch devices 200, 250 provide some of the best technology for truly scalable, RF-MEMS for the very high-performance microwave/millimeter wave broadband applications that are required to service a Layer 0 flow-based switch. Cantilever beam MEMS switch devices exhibit some key capabilities: a) minimize pull-down actuation voltage (<35V), b) limit or minimize opening time (<50 μs), c) minimize "R-on" contact resistance (~1 ohm), and d) improve signal power handling for broadband RF-MEMs switch applications (DC-50 GHz regime), allowing on the order of 150 mW per switch contact, e) reasonably small footprint of less than 200 μm-square, f) very low insertion loss of less than 1 dB/mm, and the like.

The switch cell size for the direct-contact cantilever beam MEMS switch devices 200, 250 can be approximately 200 μm×200 μm, Using a 15 mm×15 mm die area with 75% fill factor, 4096 MEMS switch devices 200, 250 on a single die are obtainable. Based on various switch architectures described in FIGS. 5-7, a simple single stage, non-blocking 128×128 switch will require 16384 MEMS switch devices 200, 250 or a four die design, but by using a reconfigurable, non-blocking, 3-stage Clos, such as the switch 100, one needs 4608 MEMS switch devices 200, 250 which can be achieved on a single die, and a full strictly, non-blocking Clos switch, such as the switch 150, one needs 8704 MEMS switch devices 200, 250 requiring two die.

Figure 10:
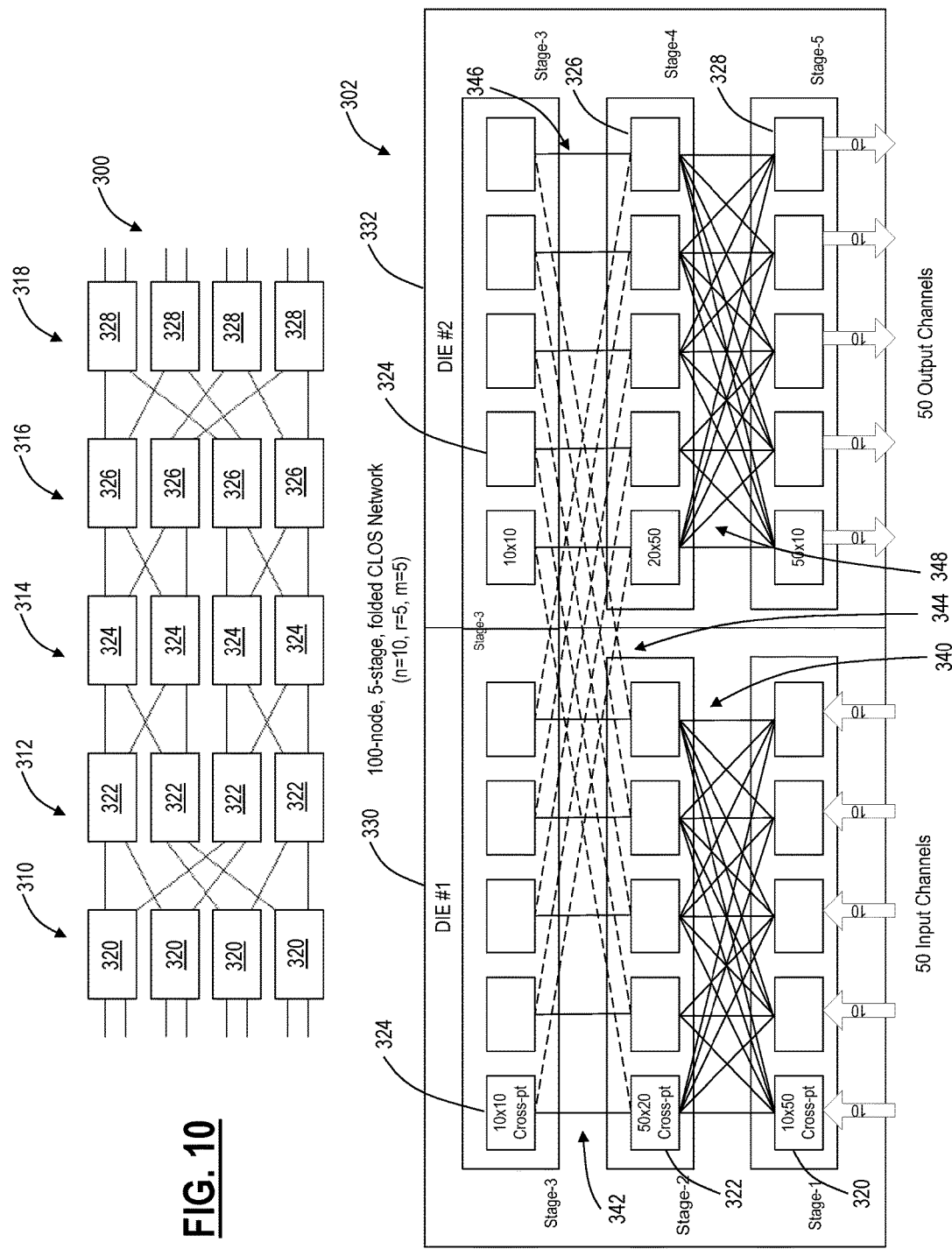
FIG. 10 is a block diagram of a 100-node, five stage, folded Clos switch and an associated multiple stacked die configuration utilizing MEMS switch devices.

Referring to FIG. 10, in an exemplary embodiment, a block diagram illustrates a 100-node, five stage, folded Clos switch 300 and an associated multiple stacked die configuration 302 utilizing MEMS switch devices. The folded Clos switch 300 includes five stages 310, 312, 314, 316, 318, and includes n=10, r=5, and m=5. The first stage 310 includes 10×50 cross-point switches 320, the second stage 312 includes 50×20 cross-point switches 322, the third stage 314 include 10×10 cross-point switches 324, the fourth stage 316 includes 20×50 cross-point switches 326, and the fifth stage 318 includes 50×10 cross-point switches. The cross-point switches 320, 322, 324, 326, 328 can include MEMS switch devices such as the MEMS switch devices 200, 250. The folded Clos switch 300 includes 50 inputs and 50 outputs, i.e., a 50×50 switch, and can be utilized as a Layer 0 flow-based switch.

The stacked die configuration 302 includes two die 330, 332. The first die 330 includes the stages 310, 312 and half of the stage 314, and the second die 332 includes the other half of the stage 314 and the stages 316, 318. The die 330, 332 include interconnections 340, 342, 344, 346, 348 between the stages 310, 312, 314, 316, 318. The interconnections 340, 342 are located on the die 330 between the stages 310, 312, 314, and the interconnections 346, 348 are located on the die 332 between the stages 314, 316, 318. The interconnection 344 is between the die 330, 332 between the stages 312, 314 and can be formed through silicon via (TSV) inter-connectivity, solder microbumps, or metal pillars.

Figure 11:
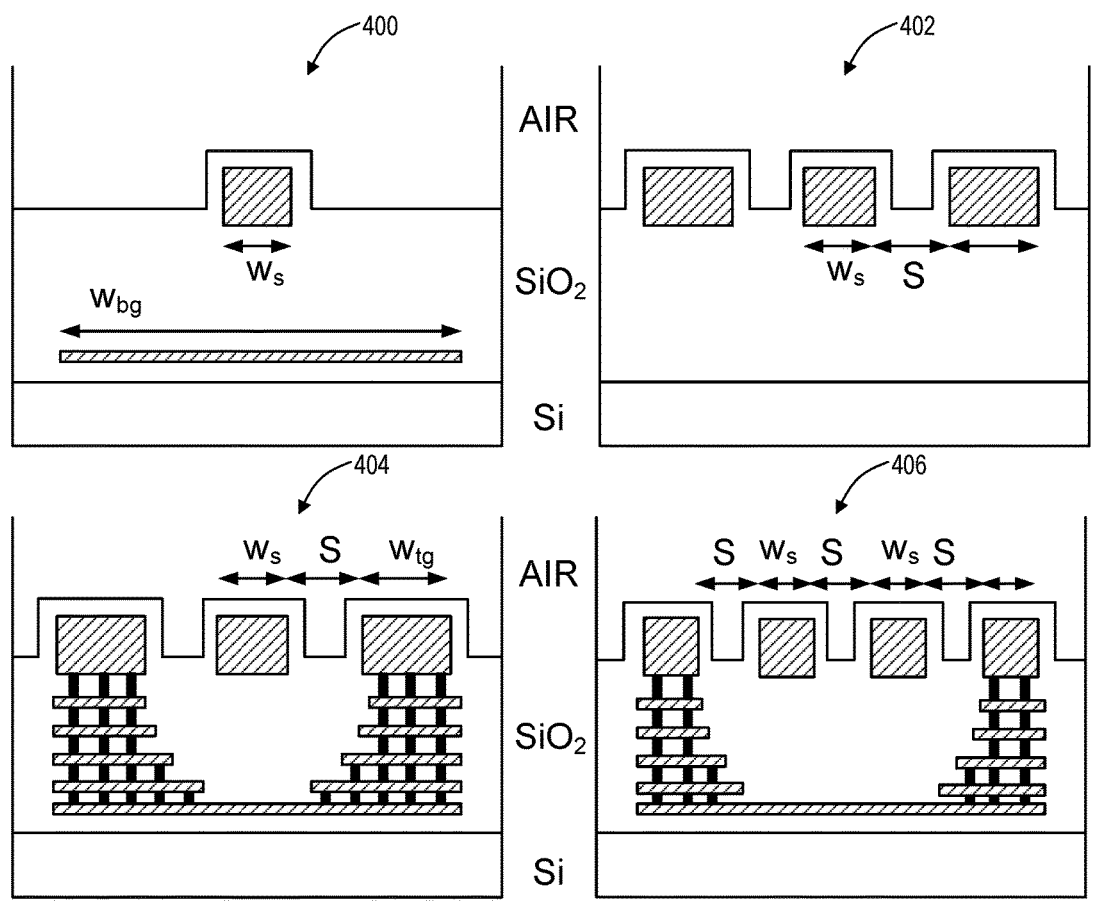
FIG. 11 is a block diagram of an RF interconnect structure for CMOS integrated circuit (IC) transmission lines for use with the MEMS switch devices on a die.

Referring to FIG. 11, in an exemplary embodiment, a block diagram illustrates RF interconnect structure for CMOS integrated circuit (IC) transmission lines for use with the MEMS switch devices 200, 250 on the die 330, 332. FIG. 11 includes cross-sectional diagrams of air, SiO2, and Si layers for a microstrip (MS) line configuration 400, a coplanar waveguide (CPW) configuration 402, a semi-coax style (SC) line configuration 404, and a differential SC (D-SC) line configuration 406. In an exemplary embodiment, the transmission lines for use with the MEMS switch devices 200, 250 are partially shielded microwave transmission lines for minimizing cross-talk. High channel count, differential, RF transmission line construction on the die 330, 332 presents one of several technical challenges, and techniques have been identified in literature to implement differential semi-coax style (D-SC) and single semi-coax S-SC structures operational above 50 GHz in 0.18 um CMOS and smaller process nodes with overall insertion loss of 0.9 dB/mm or less. For example, D-SC and S-SC techniques are described in Jin et al., "Low-Loss Single and Differential Semi-Coaxial Interconnects in Standard CMOS Process," Microwave Symposium Digest, 2006, IEEE MTT-S International, the contents of which are incorporated by reference herein. In an exemplary embodiment, the MEMS switch devices 200, 250 utilize differential signaling.

Figure 12:
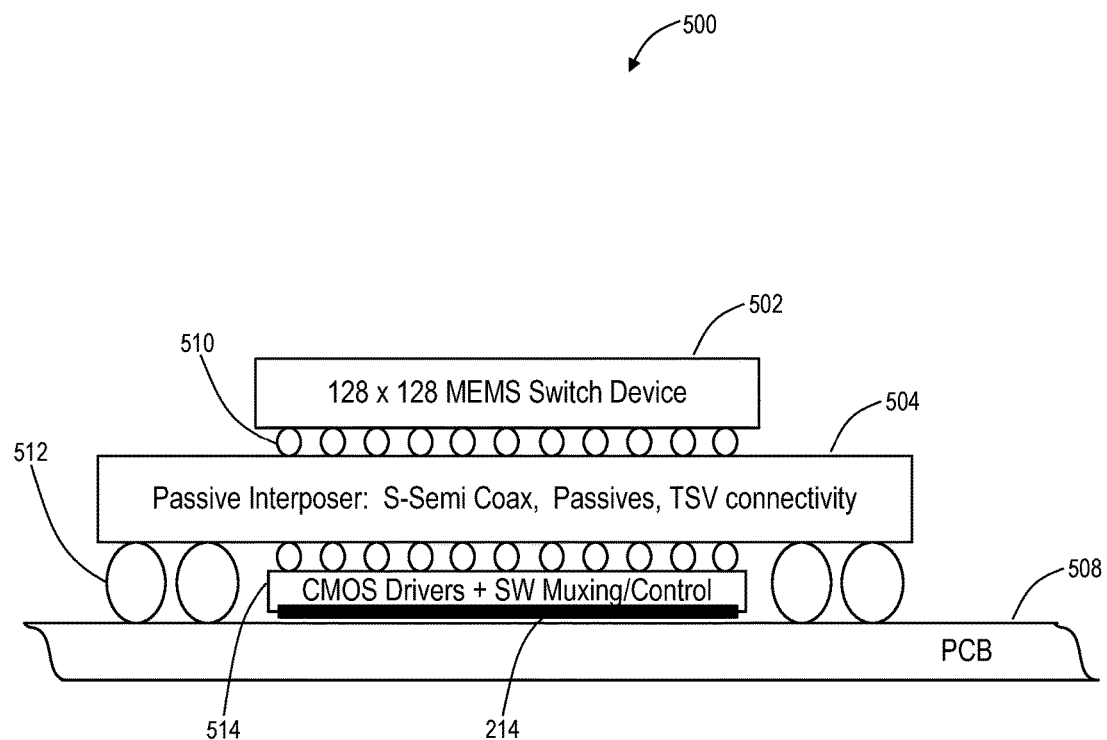
FIG. 12 is a block diagram of a packaging concept of a MEMS switch system.

Referring to FIG. 12, in an exemplary embodiment, a block diagram illustrates a packaging concept of a MEMS switch system 500. The MEMS switch system 500 includes a 128×128 MEMS switch device 502, a passive interposer 504, and a CMOS device 506 mounted on a printed circuit board (PCB) 508. The 128×128 MEMS switch device 502 is a 128×128 port switch such as the switch 100, 150 made out of the MEMS switch devices 200, 250, i.e., an RF MEMS device. The passive interposer 504 includes S-Semi coax, passives and TSV connectivity between the 128×128 MEMS switch device 502 and the CMOS device 506. The CMOS device 506 includes CMOS drivers and software multiplexing and control and can be referred to as Digital Control. The 128×128 MEMS switch device 502 is connected to the passive interposer 504 via a micro-bump or metal pillar layer 510. The passive interposer 504 is connected to the CMOS device 506 and the PCB 508 via C4 balls 512 (C4 stands for controlled collapse chip connection) which provide DC power and I/O connectivity. The CMOS device 506 includes an inverted mount 514 with a heat spreader. In this packaging concept, it is noted that the 128×128 MEMS switch device 502 is low power, and on top, while the higher power CMOS device 506 is placed on the bottom with the inverted mount 514. In an exemplary embodiment, the two sets of devices, RF MEMS (i.e., the 128×128 MEMS switch device 502) and Digital Control (i.e., the CMOS device 506) are flip-chip attached to minimize interconnect wafer real estate and parasitics, forming a compact, low-cost, and low power switching module.

In an exemplary embodiment, the 128×128 MEMS switch device 502 solely includes the MEMS switch devices 200, 250, and addressing and switch control are provided in the CMOS device 506. As described herein, coupling the cantilever MEMs switch array on a silicon die for the 128×128 MEMS switch device 502 with 128 low power CMOS output drivers while incorporating the low power, digital CMOS FET address and switch control schemes in the CMOS device 506, an extremely low power, fully integrated 128×128 cross-point switch with integrated control and output drivers can be fabricated on a single low power silicon die, manufacture-able by conventional semiconductor fabrication techniques. Further, control electronics being slow, they are implemented in a separate set of Digital MEMS devices. These devices consume negligible standby power and are ideal for reconfiguration logic functions that occur on slow timescales. However, there are significantly more control MEMS required for each RF MEMS, and much smaller photolithography would be needed, in the medium submicron range (i.e., 90 nm). The Digital MEMS are best implemented on a separate substrate, i.e., the 128×128 MEMS switch device 502 is separate from the CMOS device 506. Further, some amount of CMOS logic for signal conditioning and output data buffer drivers may be implemented on the same substrate.

Figure 13:
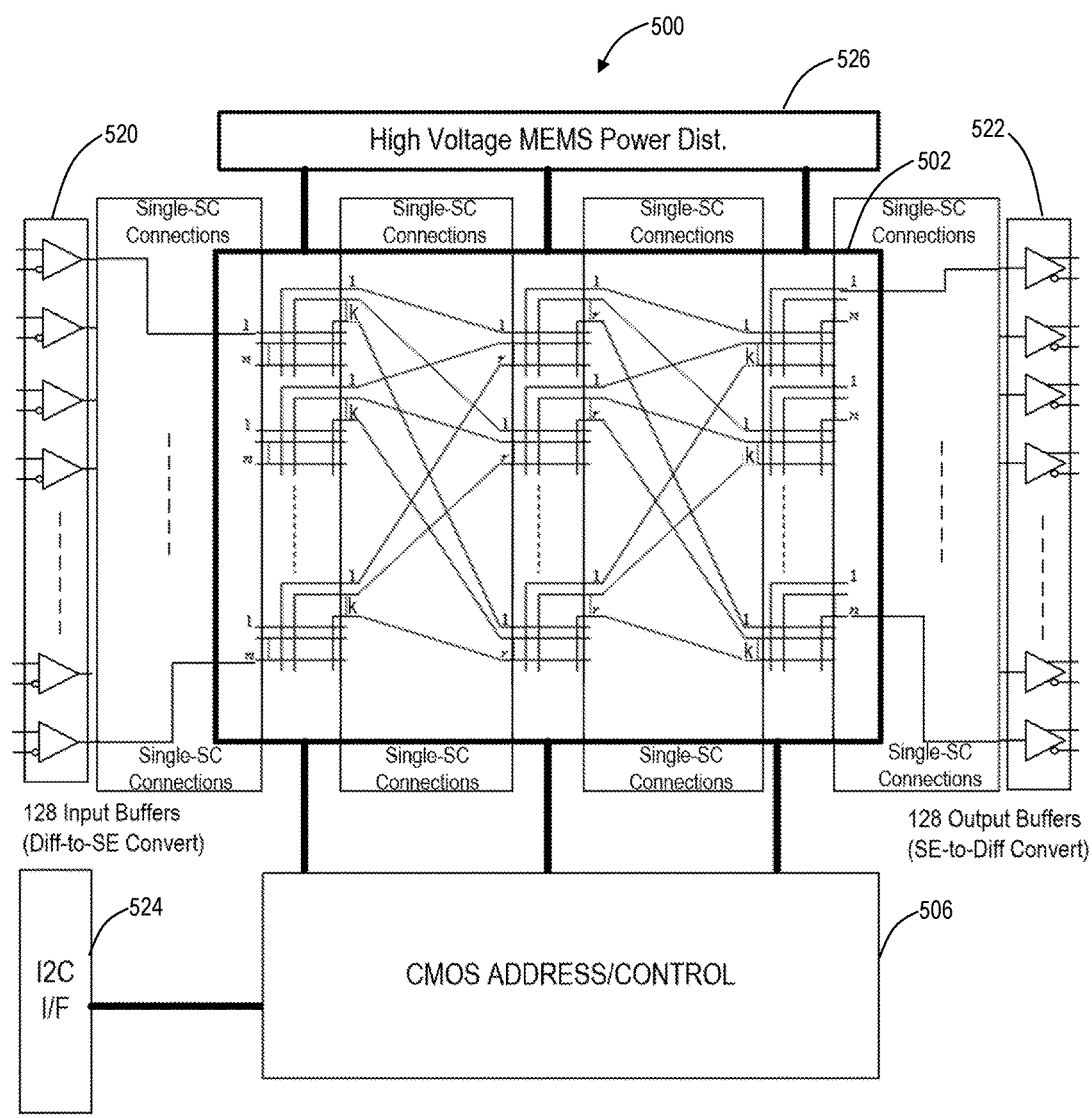
FIG. 13 is a schematic diagram of functional components of the MEMS switch system of FIG. 12.

Referring to FIG. 13, in an exemplary embodiment, a schematic diagram illustrates functional components of the MEMS switch system 500. The MEMS switch system 500 includes 128 input buffers 520 and 128 output buffers 522. In an exemplary embodiment, the 128 input buffers 520 include differential to single ended converters for each signal and the 128 output buffers 522 include single-ended to differential converters. The CMOS device 506 can be a CMOS switch multiplexer/control and can connect to an Inter-Integrated Circuit (I2C) bus 524 for data communications. The 128×128 MEMS switch device 502 includes various MEMS switch devices 200, 250 as described herein and can include single SC connections between stages. High voltage MEMS power distribution 526 is connected to each of the devices 502, 506.

Figure 14:
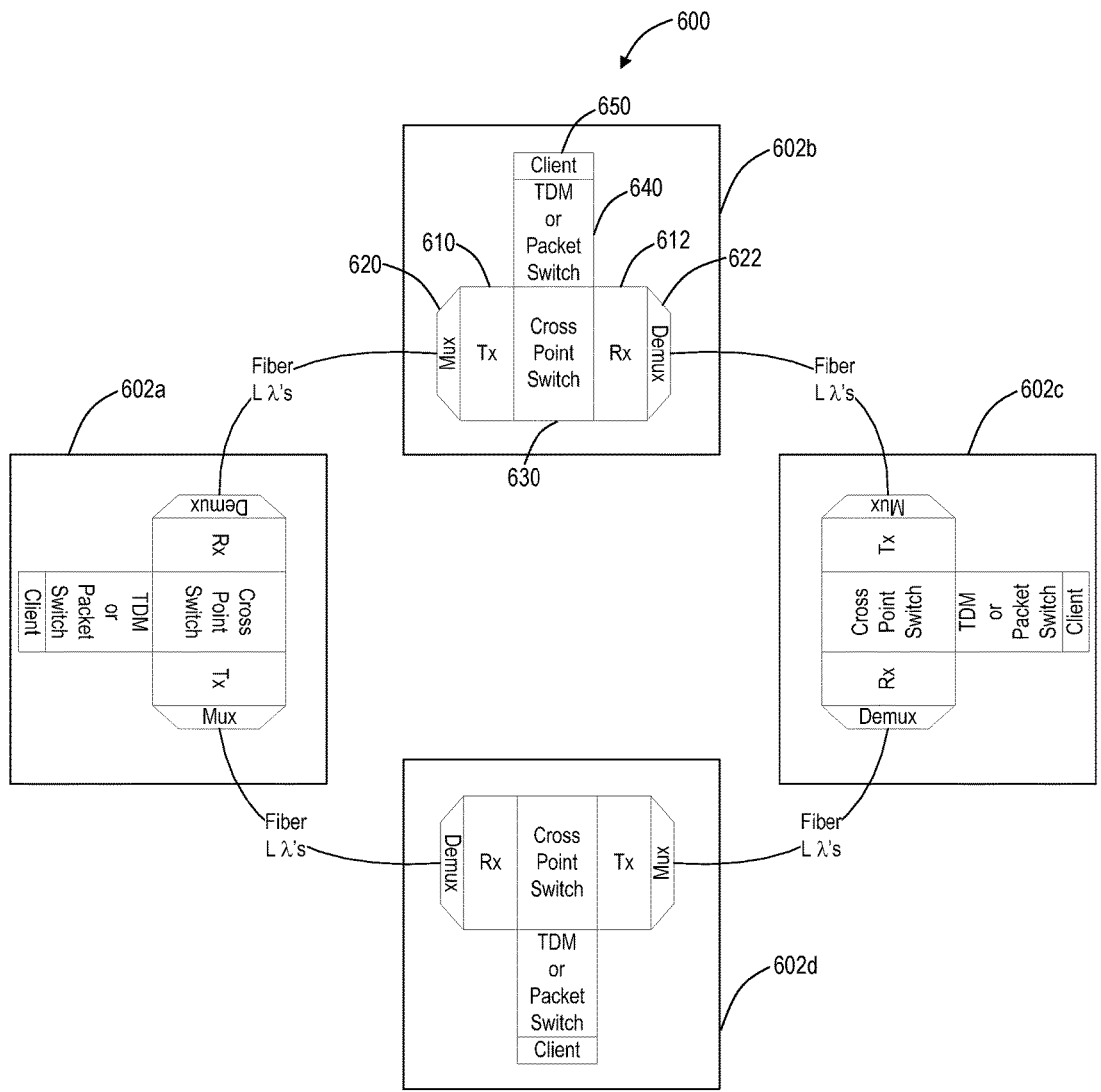
FIG. 14 is a network diagram of a network 600 illustrating an application of the MEMS-based cross-point electrical switching systems and methods.

Referring to FIG. 14, in an exemplary embodiment, a network diagram illustrates a network 600 illustrating an application of the MEMS-based cross-point electrical switching systems and methods. The network 600 includes, for illustration purposes, four nodes 602a, 602b, 602c, 602d with interconnections between the nodes 602 in a single counter-clockwise propagating signal direction. The network 600 is shown merely as an exemplary embodiment for illustration purposes of the MEMS-based cross-point electrical switching systems. Each node 602 includes a plurality of transmitters (Tx) 610 and a plurality of receivers (Rx) 612. In an exemplary embodiment, the plurality of transmitters 610 and the plurality of receivers 612 support up to L λ in a highly integrated fashion with each transmitter 610 and each receiver 612 supporting 10 Gbps or higher. For example, each of the transmitters 610 can support a different transmission wavelength for WDM, and each of the receivers 612 can be broadband in the sense that each receiver 612 is configured to receive a wavelength between 1270 nm and 1670 nm. The plurality of transmitters 610 and the plurality of receivers 612 can be referred to as a transponder array.

The plurality of transmitters 610 connect to a multiplexer 620 for a combination of the individual wavelengths from each of the transmitters 610 to a composite WDM signal. Specifically, the multiplexer 620 outputs the composite WDM signal to the fiber (or to other WDM components such as dispersion compensation devices, amplifiers, etc.). The plurality of receivers 612 connect to a demultiplexer 622 which splits individual wavelengths from the composite signal from the fiber to each of the receivers 612. Specifically, the demultiplexer 622 outputs individual wavelengths to each of the receivers 612 from the composite WDM signal off the fiber. In an exemplary embodiment, intermediate between the transmitters 610 and the receivers 612, the nodes 602 can include an electrical cross-point switch 630 for traffic grooming therebetween. The electrical cross-point switch 630 is configured to provide similar functionality as a ROADM and, as such, the electrical cross-point switch 630 can form part of a so-called Reconfigurable Electrical Add/Drop Multiplexer (READM) with similar functionality as a ROADM. In this manner, the electrical cross-point switch 630 can provide "colorless, directionless, contentionless, and waveblockless" functional equivalence to a ROADM.

Of note, conventional implementations for the functionality of the electrical cross-point switch 630 rely on optical components such as wavelength selective switches (WSSs) and the like. It is the expectation that highly-integrated CMOS implementations for the electrical cross-point switch 630 can ultimately provide significant cost reduction over conventional optical implementations of ROADMs. Note, history has shown cost reduction curves based on volume are much higher in CMOS (electrical domain) than in the optical domain. In an exemplary embodiment, the electrical cross-point switch 630 is configured to perform wavelength layer switching with minimal overhead processing between the transmitters 610 and the receivers 612. In an exemplary embodiment, the electrical cross-point switch 630 could be integrated with the transmitters 610 and the receivers 612 in the optoelectronic integrated circuit 100. In various exemplary embodiments, the electrical cross-point switch 630 can be constructed utilizing RF MEMS devices as described herein, and the size of the electrical cross-point switch 630 would be commensurate with the number of wavelengths, L, with additional ports to accommodate local Add/Drop to TDM or the Packet Switch 640.

In an exemplary embodiment, the electrical cross-point switch 630 can interface to one or more Time Division Multiplexing (TDM) or packet switches 640 at the nodes 602. In an exemplary embodiment, the switches 640 are configured to perform the sub-wavelength layer traffic grooming with the electrical cross-point switch 630 performing wavelength layer traffic grooming or flow-based switching. The switches 640 can include client interfaces 450. Alternatively, the switches 640 may be omitted with the client interfaces 650 being directly off the electrical cross-point switch 630. The switches 640 can include, without limitation, optical switches, Optical Transport Network (OTN) switches, Synchronous Optical Network (SONET) switches, Synchronous Digital Hierarchy (SDH) switches, multi-service switches, Ethernet switches, Internet Protocol (IP) routers, and the like.

Figure 15:
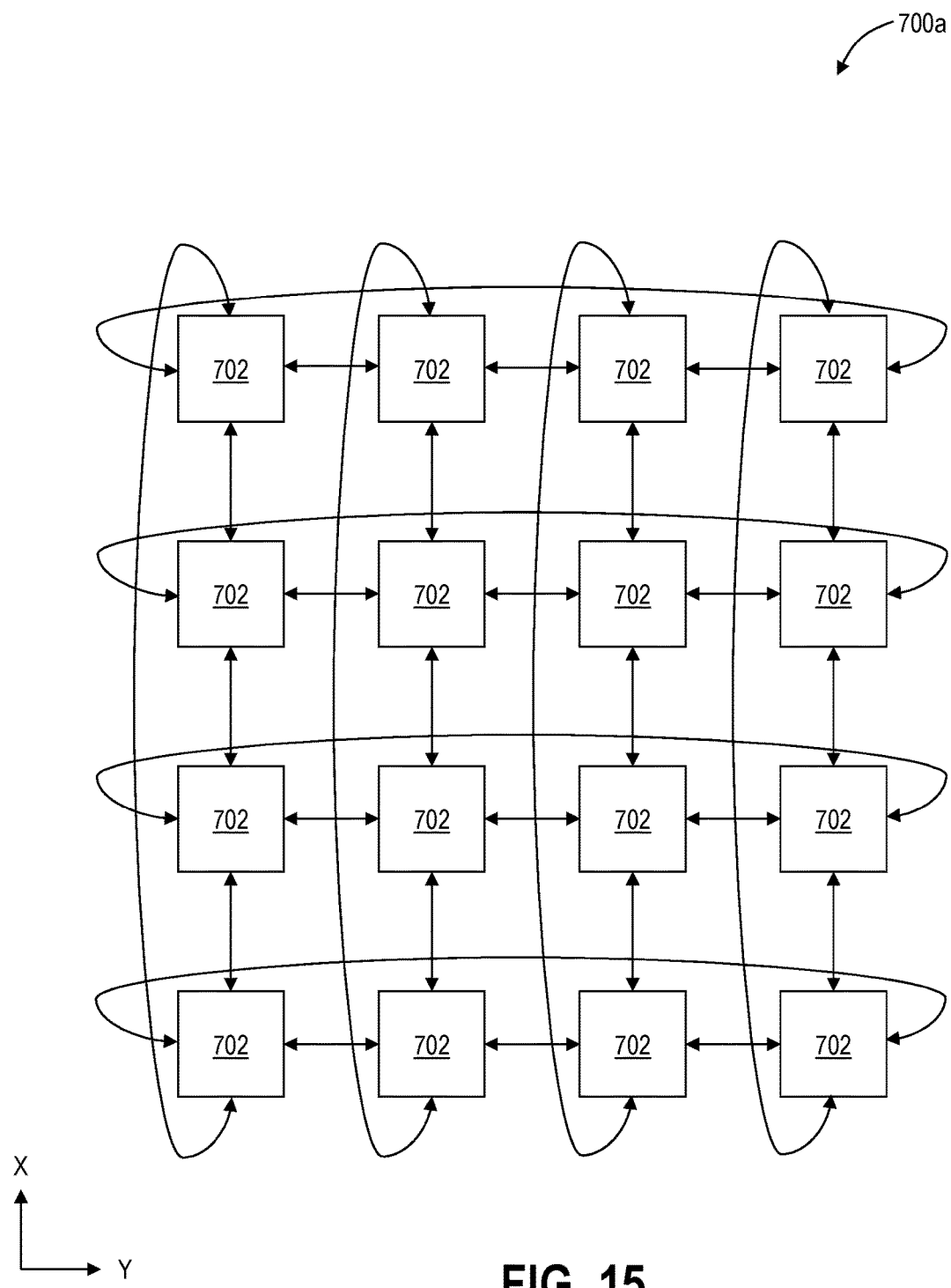
FIG. 15 is a block diagram of a two-dimensional (2D) torus switch which can be constructed using the RF MEMS-based switches.
Figure 16:
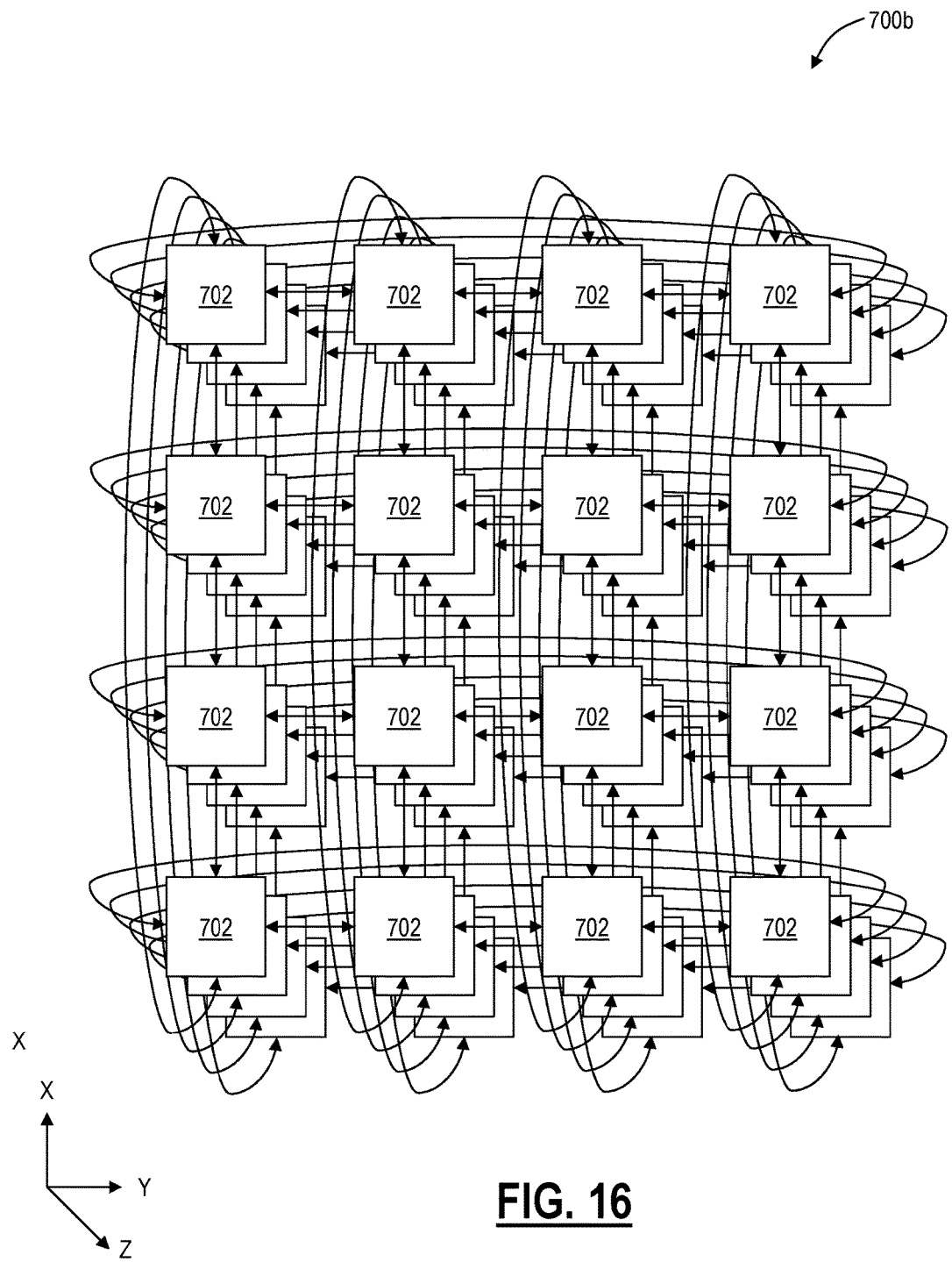
FIG. 16 is a block diagram of a three-dimensional (3D) torus switch which can be constructed using the RF MEMS-based switches.

Referring to FIGS. 15 and 16, in an exemplary embodiment, block diagrams illustrate a two-dimensional (2D) torus switch 700a (FIG. 15) and a three-dimensional (3D) torus switch 700b (FIG. 16). In various exemplary embodiments presented herein, the RF MEMS-based electrical cross-point switch has been presented in a Clos architecture. Those of ordinary skill in the art will recognize the RF MEMS-based electrical cross-point switch contemplates other types of switch architectures. For example, the torus switches 700a, 700b can be formed using the MEMS-based switches. Note, a Clos architecture does not provide "pay-as-you-grow" scalability whereas the torus switch 700a, 700b does at the expense of not being fully non-blocking. However, for a READM configuration, fully non-blocking functionality is not necessary particularly as the system scales. Importantly, for a READM configuration, the requirements are easy bandwidth expansion and easy add/drop expansion. The torus switch 700a, 700b can accomplish these requirements, particularly when coupled with a non-blocking switch at a module level, i.e., first stage.

FIG. 15 illustrates the 2D torus switch 700a which includes multiple switching nodes 702. Each switching node 702 is formed with MEMS devices and is connected to its immediate neighbor in the X-Y plane. Switching nodes 702 on the edges are connected to their corresponding switching nodes 702 on the other side in either the X or Y plane. Switching nodes 702 on the edges and the corners are connected to their corresponding switching nodes 702 on the other side in both the X and Y plane. FIG. 16 illustrates the 3D torus switch 700b which includes multiple stacked 2D torus switches 700a extending in a Z plane as well. Routing through the torus switches 700a, 700b can use a dimension ordered routing algorithm which routes first in the X-plane, then in the Y-plane, and finally in the Z-plane. This algorithm also provides for fault tolerance through the switches 700a, 700b.

Advantageously, the switches 700a, 700b can: provides good path diversity, partial non-blocking; provide programmable interconnect across the system; provide great flexibility for easily scalable, multi-degree READM architectures; provide Colorless, Directionless, Contentionless Support; provide Flexible Channel/Band/Degree Mappings, Fiber mux/demux management; support any protection scheme (Mesh/Ring/Linear, etc.), with loopbacks, test support; easily subtend to sub-wavelength grooming switches, i.e. the TDM or packet switches 640; and support Layer-0 automated control-plane management. Again, while the RF MEMS-based switches have been described herein with respect to a single stage fabric (e.g., the switch 150), Clos architectures (e.g., the switches 100, 150, 300), and a torus architecture (e.g., the switches 700a, 700b), those of ordinary skill in the art will recognize that any architecture can be used to build an N×M cross-point switch using the RF MEMS-based switches.

Figure 17:
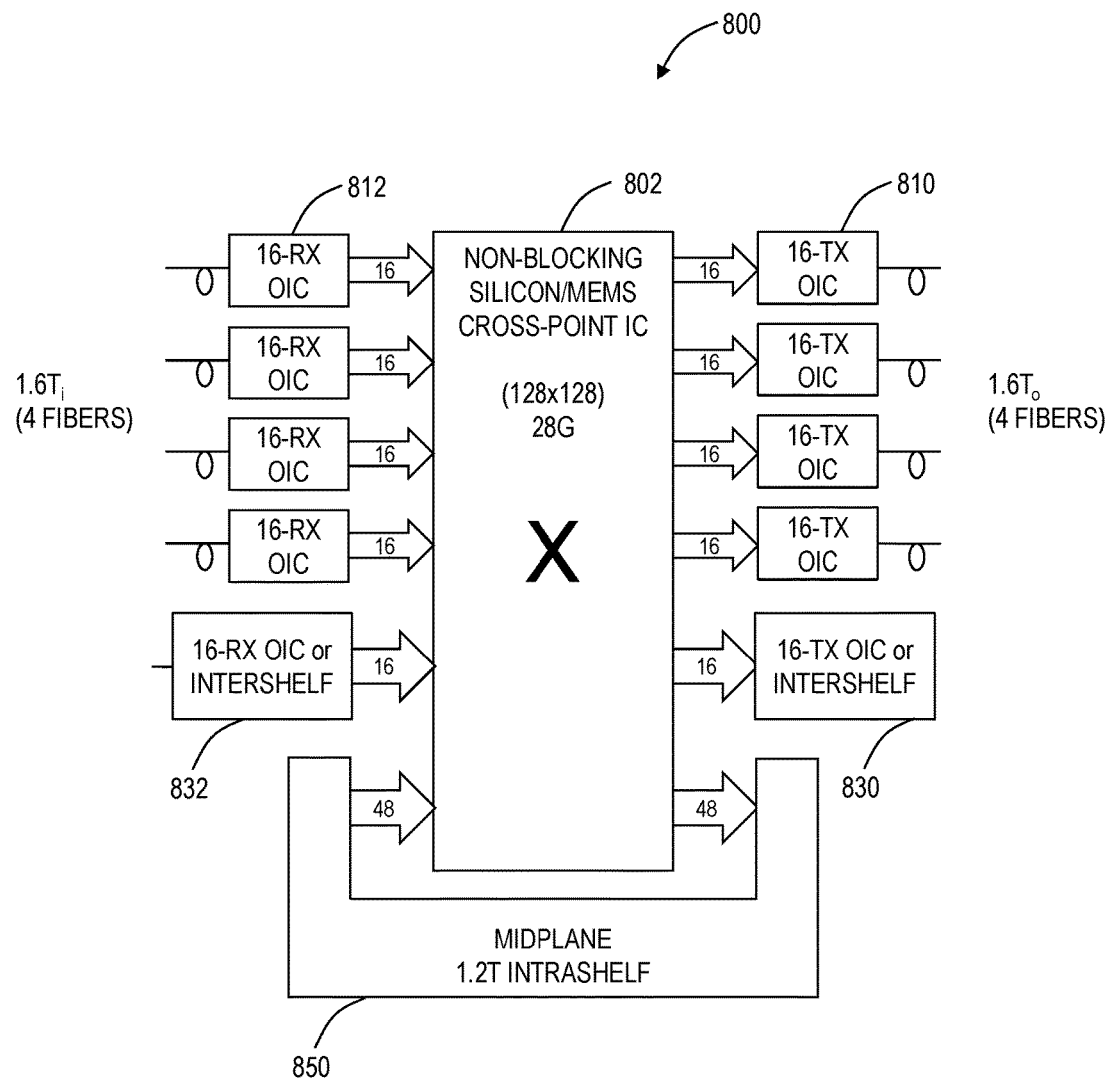
FIG. 17 is a block diagram of an exemplary implementation of a switching node utilizing an RF MEMS-based electrical cross-point switch.

Referring to FIG. 17 in an exemplary embodiment, a block diagram illustrates an exemplary implementation of a switching node 800 utilizing an RF MEMS-based electrical cross-point switch 802. In an exemplary embodiment, the switching node 802 supports 1.6 Tbps. The switching node 800 includes four 16 channel transmitter optoelectronic integrated circuits (OICs) 810, four 16 channel receiver OICs 812, the non-blocking cross-point switch 802, a 16 channel transmitter or intershelf connection 830, and a 16 channel receiver or intershelf connection 832. The transmitter OICs 810 and the receiver OICs 812 can be implemented as optoelectronic integrated circuits. The receiver OICs 812, 832 form 1.6 Tbps input (1.6 $T_i$) into the switching node 800, and the transmitters OICs 810, 830 form 1.6 Tbps output (1.6 $T_o$) out of the switching node 800. In an exemplary embodiment, the OICs 810, 812 can form ingress or egress degrees for the switching node 800 or add/drop points for the switching node 800. For the add/drop points, the OICs 830, 832 can realize the X-plane in the torus switches 700a, 700b.

The connection 830 and the connection 832 provide channels into and out of the switching node 800, i.e., inter-shelf communication, for example. The connection 830 and the connection 832 can realize the X and Z-plane in the torus switches 700a, 700b. The switching node 800 also includes a 1.2 Tbps connection to a midplane 850, i.e., 1.2 Tb/s intra-shelf communication. The midplane 850 can realize the Y-plane in the torus switches 700a, 700b. The non-blocking cross-point switch 802 can be a 128×128 channel non-blocking cross-point switch using RF MEMS switches as discussed herein. Each of the OICs 810, 812, the connection 830, the connection 832, and the midplane 850 are communicatively coupled to the non-blocking cross-point switch 802. Of note, the systems and methods described herein envision an "electronic READM on a chip," with high port count MEMs switching, i.e., 100 to 1000, 10G or 28G or beyond circuits, and integrated with silicon photonic circuits in the same module (same die or separate die). That is, there are possibilities to integrate the OICs 810, 812 with the non-blocking cross-point switch 802.

It will be appreciated that some exemplary embodiments described herein may include one or more generic or specialized processors ("one or more processors") such as microprocessors, digital signal processors, customized processors, and field programmable gate arrays (FPGAs) and unique stored program instructions (including both software and firmware) that control the one or more processors to implement, in conjunction with certain non-processor circuits, some, most, or all of the functions of the methods and/or systems described herein. Alternatively, some or all functions may be implemented by a state machine that has no stored program instructions, or in one or more application specific integrated circuits (ASICs), in which each function or some combinations of certain of the functions are implemented as custom logic. Of course, a combination of the aforementioned approaches may be used. Moreover, some exemplary embodiments may be implemented as a non-transitory computer-readable storage medium having computer readable code stored thereon for programming a computer, server, appliance, device, etc. each of which may include a processor to perform methods as described and claimed herein. Examples of such computer-readable storage mediums include, but are not limited to, a hard disk, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory), Flash memory, and the like.

When stored in the non-transitory computer-readable medium, software can include instructions executable by a processor that, in response to such execution, cause a processor or any other circuitry to perform a set of operations, steps, methods, processes, algorithms, etc.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. An electrical cross-point switch, comprising:
   N inputs, each at least 10 Gbps, electrically connected to input transmission lines;
   M outputs, each at least 10 Gbps, electrically connected to output transmission lines;
   at least two Radio Frequency (RF) Microelectromechanical systems (MEMS) switches selectively and electrically interconnecting each input transmission line and each output transmission line; and
   control and addressing circuitry configured to selectively control interconnection of each input transmission line and each output transmission line via the at least two RF MEMS switches,
   wherein the at least two RF MEMS switches are each formed on a first die with the input transmission lines and the output transmission lines, and
   wherein the at least two RF MEMS switches comprise three RF MEMS with a first RF MEMS switch on the respective input transmission line, a second RF MEMS switch on the respective output transmission line, and a third RF MEMS switch interconnecting the respective input transmission line and the respective output transmission line.

2. The electrical cross-point switch of claim 1, wherein the at least two RF MEMS switches are embedded in each input transmission line and each output transmission line.

3. The electrical cross-point switch of claim 1, wherein the input transmission lines and the output transmission lines are each partially shielded microwave transmission lines.

4. The electrical cross-point switch of claim 1, wherein N and M are equal and greater than or equal to 32.

5. The electrical cross-point switch of claim 1, wherein the control and addressing circuitry is formed on a second die interconnected to the first die through silicon vias, micro bumps, or metal pillars.

6. The electrical cross-point switch of claim 5, wherein the first die and the second die are flip-chip attached.

7. The electrical cross-point switch of claim 1, wherein the at least two RF MEMS switches are each formed on a first die with interconnections between one another through one of differential semi-coax style (D-SC) and single semi-coax (S-SC) structures.

8. The electrical cross-point switch of claim 1, wherein the control and addressing circuitry comprises digital control implemented on a separate substrate from each of the at least two RF MEMS switches, the input transmission lines, and the output transmission lines.

9. The electrical cross-point switch of claim 1, wherein the control and addressing circuitry are implemented in CMOS.

10. The electrical cross-point switch of claim 1, wherein the at least two RF MEMS switches utilize a row fan-out to column fan-out between the input transmission lines and the output transmission lines.

11. The electrical cross-point switch of claim 1, wherein the at least two RF MEMS switches utilize a simple cantilever MEMS switch each with a cantilever beam, a pull-down electrode, and an RF transmission line electrode.

12. The electrical cross-point switch of claim 1, wherein the at least two RF MEMS switches utilize a direct-contact cantilever MEMS switch each with a cantilever beam, a pull-down electrode, an RF transmission line electrode, and a dimple on the cantilever beam that makes contact with the RF transmission line electrode during an ON state.

13. An electrical cross-point switch system, comprising:
   a first die comprising N inputs, each at least 10 Gbps, electrically connected to input transmission lines, M outputs, each at least 10 Gbps, electrically connected to output transmission lines, and at least two Radio Frequency (RF) Microelectromechanical systems (MEMS) switches selectively and electrically interconnecting each input transmission line and each output transmission line;
   a second die comprising control and addressing circuitry configured to selectively control interconnection of each input transmission line and each output transmission line via the at least two RF MEMS switches; and
   interconnections between the one or more first die and the second die through silicon vias, micro bumps, or metal pillars,
   wherein the at least two RF MEMS switches comprise three RF MEMS with a first RF MEMS switch on the respective input transmission line, a second RF MEMS switch on the respective output transmission line, and a third RF MEMS switch interconnecting the respective input transmission line and the respective output transmission line.

14. The electrical cross-point switch system of claim 13, wherein the at least two RF MEMS switches are embedded in each input transmission line and each output transmission line.

15. The electrical cross-point switch system of claim 13, wherein the input transmission lines and the output transmission lines are each partially shielded microwave transmission lines.

16. The electrical cross-point switch system of claim 13, wherein the at least two RF MEMS switches utilize a row fan-out to column fan-out between the input transmission lines and the output transmission lines.

17. The electrical cross-point switch system of claim 13, wherein the at least two RF MEMS switches utilize a cantilever MEMS switch each with a cantilever beam, a pull-down electrode, and an RF transmission line electrode.

18. A method, comprising:
   electrically receiving N inputs, each at least 10 Gbps, at input transmission lines;
   selectively and electrically interconnecting each input transmission line to a respective output transmission line via at least two Radio Frequency (RF) Microelectromechanical systems (MEMS) switches; and
   controlling the at least two RF MEMS switches to provide cross-point switching between the N inputs and M outputs,
   wherein the at least two RF MEMS switches are each formed on a first die with the input transmission lines and the output transmission lines, and wherein the at least two RF MEMS switches comprise three RF MEMS with a first RF MEMS switch on the respective input transmission line, a second RF MEMS switch on the respective output transmission line, and a third RF MEMS switch interconnecting the respective input transmission line and the respective output transmission line.

* * * * *